(12) United States Patent
Cao et al.

(10) Patent No.: US 11,326,744 B2
(45) Date of Patent: May 10, 2022

(54) LED BULB APPARATUS

(71) Applicant: XIAMEN ECO LIGHTING CO. LTD., Xiamen (CN)

(72) Inventors: Liang Liang Cao, Xiamen (CN); Cheng Zong Wu, Xiamen (CN); Hong Kui Jiang, Xiamen (CN); Yanzeng Gao, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/893,339

(22) Filed: Jun. 4, 2020

(65) Prior Publication Data

US 2021/0381658 A1    Dec. 9, 2021

(51) Int. Cl.
| | |
|---|---|
| *F21K 9/235* | (2016.01) |
| *F21K 9/232* | (2016.01) |
| *F21V 29/70* | (2015.01) |
| *F21K 9/64* | (2016.01) |
| *F21V 23/00* | (2015.01) |
| *F21Y 115/10* | (2016.01) |

(52) U.S. Cl.
CPC .............. *F21K 9/235* (2016.08); *F21K 9/232* (2016.08); *F21K 9/64* (2016.08); *F21V 23/003* (2013.01); *F21V 29/70* (2015.01); *F21Y 2115/10* (2016.08)

(58) Field of Classification Search
CPC . F21K 9/232; F21K 9/235; F21K 9/64; F21V 29/70; F21V 23/003
See application file for complete search history.

(56) References Cited

U.S. PATENT DOCUMENTS

| | | | |
|---|---|---|---|
| 2019/0139943 A1* | 5/2019 | Tiwari | H01L 25/0753 |
| 2019/0203921 A1* | 7/2019 | He | F21V 7/22 |
| 2019/0257478 A1* | 8/2019 | Wang | F21V 23/06 |
| 2020/0182413 A1* | 6/2020 | Jiang | H05B 45/30 |

\* cited by examiner

*Primary Examiner* — Thomas M Sember
(74) *Attorney, Agent, or Firm* — Chun-Ming Shih; Lanway IPR Services

(57) ABSTRACT

A LED bulb apparatus has a bulb shell, a head cap, a driver circuit and at least one light strip. The bulb shell has a light passing shell and a bottom portion. A head cap has a neck portion, a first electrode and a second electrode. The neck portion of the head cap is connected to the bottom portion of the bulb shell forming a container space. A fluorescent layer covers the multiple LED modules. The driving current is transmitted via at least one of the top end and the bottom end of the light strip to the LED modules. The substrate has a light transmittance less than 50%.

18 Claims, 32 Drawing Sheets

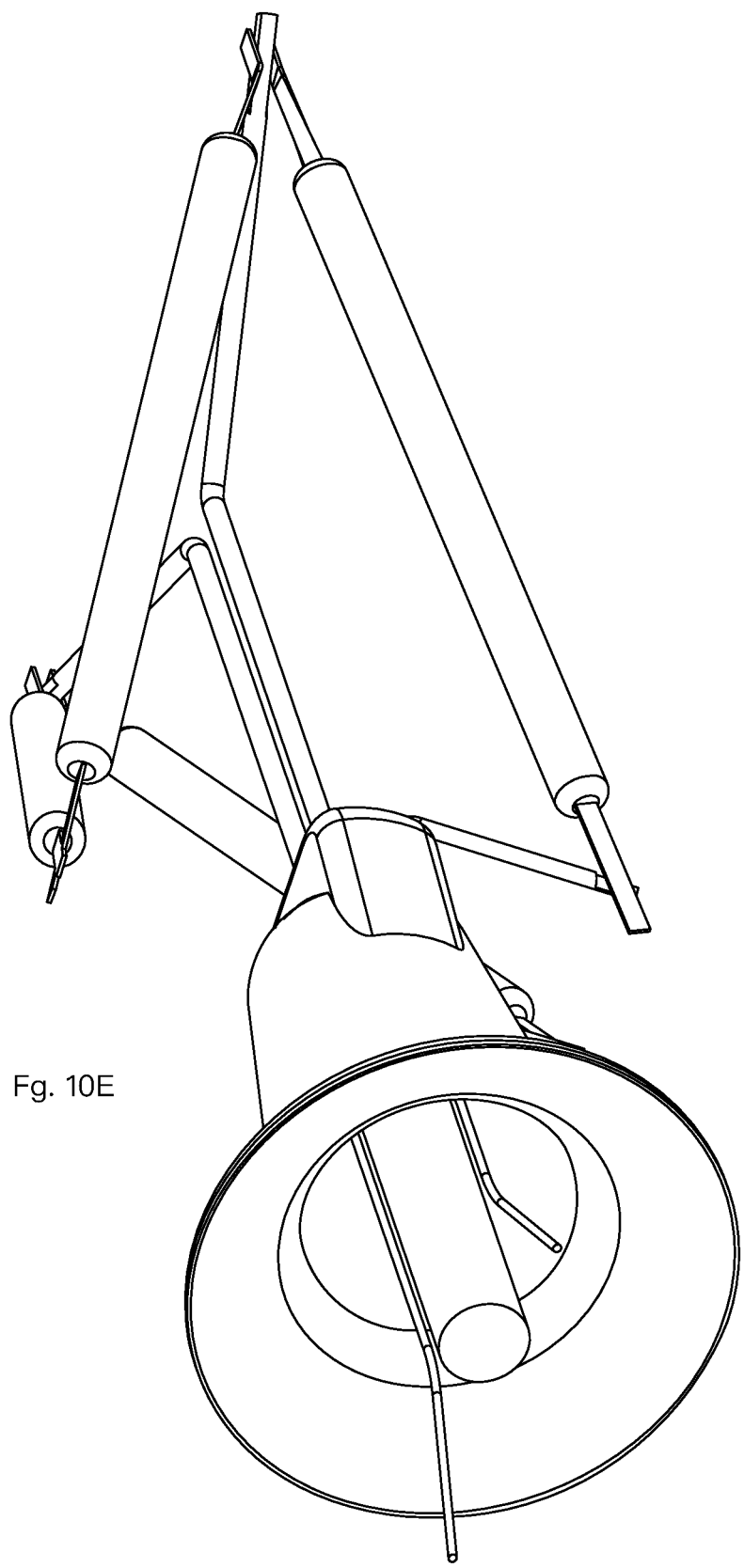
Fg. 10E

LED BULB APPARATUS

FILED OF THE INVENTION

The present invention is related to a light bulb apparatus and more particularly related to a light bulb apparatus with light strips.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

Even now, light bulbs are popular in various applications and places. When incandescent lights are replaced, not only luminance functions, but also visual effects need to be considered. To ensure such effects, factors need to be considered to design a reliable light bulb. It is beneficial to take such challenge, particularly when needs of light bulb devices are still strong and will be in the near future.

Therefore, it is very beneficial to develop a cost-effective solution for finding ways to apply LED technology in filament bulb applications.

SUMMARY OF INVENTION

In some embodiments, a LED bulb apparatus includes a bulb shell, a head cap, a driver circuit and at least one light strip. The bulb shell has a light passing shell and a bottom portion. The head cap has a neck portion, a first electrode and a second electrode. The neck portion of the head cap is connected to the bottom portion of the bulb shell forming a container space. The driver circuit is stored in the head cap for receiving an external power from the first electrode and the second electrode to generate a driving current.

At least one light strip has a substrate, a top end, a bottom end, and multiple LED modules mounted the substrate. A first fluorescent layer covers the multiple LED modules on a first side of the substrate. A second fluorescent layer covers a second side of the substrate.

The first side and the second side of the substrate are opposite. The driving current is transmitted via at least one of the top end and the bottom end of the light strip to the LED modules.

In some embodiments, the substrate of the light strip includes a ceramic layer.

In some embodiments, the light strip further includes at least one heat dissipation strip fixed to the substrate. The heat dissipation strip is heat conductive to the LED modules and electricity insulated from the LED module for carrying heat of the LED modules away from the LED modules.

In some embodiments, the second side of the substrate is mounted with another LED modules.

In some embodiments, only the first side of the substrate is mounted with the LED modules. A portion of light emitted by the LED modules from the first side of the substrate passes through the substrate and the second fluorescent layer.

In some embodiments, the substrate has a light transmittance less than 50%.

In some embodiments, the substrate has at least one through hole, the light of the LED modules passes through the through hole from the first side of the substrate to the second side of the substrate and then passes through the second fluorescent layer.

In some embodiments, a portion of the first fluorescent layer is extended into the through hole.

In some embodiments, a portion of the second fluorescent layer is extended into the through hole.

In some embodiments, there is a convex structure disposed in an inner wall of the through hole.

In some embodiments, the substrate has a hook structure protruding from a main surface of the substrate. The hook structure is penetrating into the first fluorescent layer.

In some embodiments, a lateral wall has a hook structure.

In some embodiments, the first fluorescent layer and the second fluorescent layer are connected wrapping the substrate.

In some embodiments, the first fluorescent layer has a larger thickness than the second fluorescent layer.

In some embodiments, a lateral side of the substrate is attached with anti-blue-light layer.

In some embodiments, the first fluorescent layer and the second fluorescent layer convert a light of the LED modules to output lights of different optical parameters.

In some embodiments, the container space is sealed to keep a heat dissipation air storing in the container space, the heat dissipation air including oxygen.

In some embodiments, the oxygen occupies 1% to 10% of the heat dissipation air.

In some embodiments, the oxygen occupies 3% to 8% of the heat dissipation air.

In some embodiments, the heat dissipation air includes Helium.

In some embodiments, a LED bulb apparatus has a bulb shell, a head cap, a driver circuit and at least one light strip.

The bulb shell has a light passing shell and a bottom portion. A head cap has a neck portion, a first electrode and a second electrode. The neck portion of the head cap is connected to the bottom portion of the bulb shell forming a container space. The first electrode and the second electrode may be a lateral wall metal wall and a bottom metal pin in an Edison cap.

The driver circuit is stored in the head cap for receiving an external power from the first electrode and the second electrode to generate a driving current.

There may be one or multiple light strips. Each light strip has a substrate, a top end, a bottom end and multiple LED modules. The multiple LED modules are mounted on the substrate. A fluorescent layer covers the multiple LED modules. The driving current is transmitted via at least one of the top end and the bottom end of the light strip to the LED modules. The substrate has a light transmittance less than 50%. Specifically, the substrate is not transparent. Light does not completely pass through the substrate or is completely blocked by the substrate. The substrate may be an elongated structure. In some embodiments, the substrate allows certain ratio of light to pass through, e.g. 20% to 30% light passing through the substrate.

In some embodiments, the substrate of the light strip includes a ceramic layer. Specifically, the ceramic layer may be made of Al2O3 material, which has much better heat dissipation characteristic than common transparent material.

In some embodiments, the substrate is a flexible printed circuit board with copper material attached to increase heat dissipation effect. Blue gem layer may also be used in some embodiments. Soft aluminum strip may also be used forming the substrate in some embodiments.

In some embodiments, the light strip further including at least one heat dissipation strip fixed to the substrate, the heat dissipation strip is heat conductive to the LED modules and electricity insulated from the LED module for carrying heat of the LED modules away from the LED modules.

In some embodiments, the substrate of the light strip includes a translucent glass layer.

In some embodiments, the substrate of the light strip includes a graphene layer.

In some embodiments, the substrate has a top side and a bottom side. The top side and the bottom side are respectively mounted with LED modules. Specifically, one light strip has two sides of light sources for emitting light from both sides in such embodiments.

In some embodiments, the LED modules on the top side of the substrate have a different color temperature as the color temperature of the LED modules on the bottom side of the substrate. The color temperatures of two sides of a light strip are different makes the light strip bringing a richer visual effect better than single color temperature.

In some embodiments, the LED bulb apparatus may also include a central column supporting multiple light strips. There may be supporting metal strips for fixing the light strip to expand the light strip in a desired position to adjust light emitting pattern.

In some embodiments, the central column is made of transparent material, e.g. glass or transparent plastic material.

In some embodiments, the LED bulb apparatus may also include a base part. The central column is extended from the base part, the base part having an air passage for filling the heat dissipation into the container space before the air passage is sealed for forming the container space together with the bulb shell.

In some embodiments, the container space is sealed to keep a heat dissipation air storing in the container space. The heat dissipation air including oxygen.

In some embodiments, the oxygen occupies 1% to 10% of the heat dissipation air, e.g. mole number or weight of the oxygen relative to overall heat dissipation air.

In some embodiments, the oxygen occupies 3% to 8% of the heat dissipation air.

In some embodiments, the heat dissipation air includes sparkling particles flowing within the container space when heat of the LED modules heats the heat dissipation air. Such sparkling particles add visual effect of the light bulb. Such sparkling particles may be made of small particles with reflective appearance easily floating and moving in the container space. Heat of the LED modules makes air flowing in the container space and brings the sparkling particles to move around.

In some embodiments, the heat dissipation air includes Helium.

In some embodiments, the substrate is a prism structure with a first side and a second side for respectively mounting the LED modules. The first side and the second side have a tilt angle between 20 degrees to 160 degrees.

In some embodiments, the substrate is a tube structure with an inner space.

In some embodiments, a heat dissipation material is filled in the inner space of the substrate.

In some embodiments, the LED modules have multiple types having different optical parameters for mixing a mixed optical parameter controlled by the driver circuit.

In some embodiments, the LED modules are electrically connected forming an inverted LED path having two ends terminals on only one of the top end and the bottom end.

According to an embodiment of the present invention, a light bulb apparatus has a head cup, a bottom support, multiple light strips and a bulb shell.

The head cup is designed to be connected to an external power source, e.g. complying with various Edison bulb cap standards. The head cup also has a containing space for storing a driver circuit for converting external power source to proper driving current to drive the LED components of the light apparatus.

The bottom support is connected and extended from the head cup. Parts of the bottom support are made of glass material. To provide better heat dissipation, heat dissipation air may be introduced into the bulb apparatus. In such case, the glass part of the bottom support may have a through hole to letting heat dissipation air into the bulb apparatus and then sealed during manufacturing.

The bottom support may be integrated with the bulb shell when they are both made of glass material. In addition to the glass part, there may be other material to form other parts of the bottom support.

The multiple light strips are mounted with LED modules. The LED modules may have different color temperatures and mixed to form a desired color temperature. In addition, the driver circuit may be configured to change luminous level of the LED modules, e.g. changing driving currents supplied to the LED modules.

In some embodiments, the LED modules have different types of LED modules with different color temperatures. The driver circuit may be configured to provide different driving current to different types of the LED modules so that when the LED are turned brighter, the mixed color temperature is more like a day light and when the LED are turned less brighter, the mixed color temperature is more like color temperature during sunset.

Each light strip has a top end and a bottom end. The bottom ends of the light strips are connected to the bottom support for being electrically connected to the driver circuit. In other words, the driver circuit provides driving current to the light strips via components of the bottom support, e.g. some metal bars or strips.

The top ends of the light strips form a top polygonal shape, and the bottom ends of the light strips form a bottom polygonal shape. The bottom polygonal shape has a bigger area size than the top polygonal shape. Since each light strip has a top end and a bottom end, the top polygonal shape may be geometrically similar, in some case, to the bottom polygonal shape. For example, the top polygonal shape and the bottom polygonal shape are both hexagonal shapes, just with different area sizes.

Each light strip has a skewed angle with respect to a middle axis perpendicular to the bottom polygonal shape. The middle axis is a virtual axis perpendicular to the bottom polygonal shape and extends from the middle of the bottom polygonal shape. The light strips surround the middle axis and are skewed with a skewed angle so that their projection are still not parallel to the middle axis.

The bulb shell is extended from the head cup covering the bottom support and the plurality of light strips.

In some embodiments, the bulb apparatus may further have a central support. The central support has a bottom part connected to the bottom support and having a top part connected to the top ends of the plurality of the light strips.

In some embodiments, the central support is a vertical bar that has its bottom part connected to the bottom support and its top part connecting to the top ends of the multiple light strips.

In some embodiments, the vertical bar has a metal top portion and an insulation middle portion. The insulation middle portion may be made of transparent plastic material or glass material to have a better appearance.

In some embodiments, the vertical bar has a metal part embedded in a glass portion of the bottom support. This may be implemented by placing the metal part in a molding device and then covered with fluid heated glass. After the glass is cooled, the metal part is sealed in the bottom support.

In some embodiments, the vertical bar is a tube. Such method reduces material usage and saves cost while keeping rigidity of the vertical bar.

In some embodiments, the vertical bar is an elongated folded metal sheet. In other words, an elongated sheet is folded to increase its rigidity.

In some embodiments, the vertical bar is metal material and has one more fins to help heat dissipation.

In some embodiments, the light bulb apparatus may further include a bracket for connecting the top ends of the light trips to the vertical bar.

The bracket may have multiple metal bars, or in other way, e.g. a circle shape with a bar connected to the vertical bar.

In some cases, the bracket has multiple metal bars and parts of the metal bars are welded to the vertical bar.

In some embodiments, the bracket may have multiple metal bars, parts of the metal bars are embedded to a glass portion of the vertical bar. Like what being explained above, when the vertical bar is made of glass material, parts of the bracket may be placed in a molding device and filled with fluid heated glass material. When the glass material is cooled down, the bracket is fixed to the vertical bar.

In some embodiments, the top end of the light strip has a metal portion extended from a substrate of the light strip. In such case, the light strip is made of a substrate mounted with LED modules that are further covered by fluorescent material. The substrate has a metal part and the metal part is extended to the top end of the light strip. In other words, the top end and the substrate of the light strip is one piece, which may be cut from a metal sheet.

The top ends of the light strips may be folded to keep the light strip with a distance from the vertical bar.

In some cases, two light strips are made together and form a pair. In such pair, the two light strips share the same metal material and thus their top ends are two portion of a one piece material. In such case, the connection between the two light strips has better electricity conductivity and may decrease unnecessary heat due to resistance of the connected portion between the two light strips.

Therefore, in a light bulb apparatus of such case, if there are six light strips, there are three pairs of light strips placed in the bulb apparatus, instead of fixing six independent light strips together, which may also decrease manufacturing time and difficulty.

In some embodiments, a connection part of the top ends of the two light strips surrounds the vertical bar. For example, the top ends of two light strips are welded together while leaving a hole in the middle of the connection. The vertical bar is placed in the middle of the connection, thus increasing robustness of overall light bulb structure.

In some embodiments, the top ends of the light strips are separately connected to a bracket and the bracket enables electrical connection between the two ends of the light strips. For example, the bracket may have multiple metal bars as mentioned above. The top ends of the light strips are separately welded to the metal bars. With the metal bar as an intermediate component, the light strips may be connected in desired connection manner, e.g. connected in series or in parallel.

Usually, the light strips have a major light emitting angle, e.g. 120 degrees. The central direction of the light emitting span is named as the major light direction.

In some embodiments, the major light directions of the light strips lean toward the bottom support. Specifically, the major light directions are directed to lower portion, instead of top portion, of the light bulb apparatus, i.e. more close to the bottom support instead of close to the top ends of the light strips.

To further enhance overall light pattern, the major light directions of the light strips also lean toward dark part of neighbor light strips. For example, the major direction of one light strip is directed to dark part, out of main light angle span area, of a neighbor light strip.

In some embodiments, there are more than one vertical bars for the central support. To increase the top polygonal shape of the light bulb apparatus, the top parts of these vertical bars are bent and connected to the top ends of the light strips.

BRIEF DESCRIPTION OF DRAWINGS

FIG. 10E illustrates the embodiment of FIG. 10A in another view angle.

DETAILED DESCRIPTION

Figure 1:
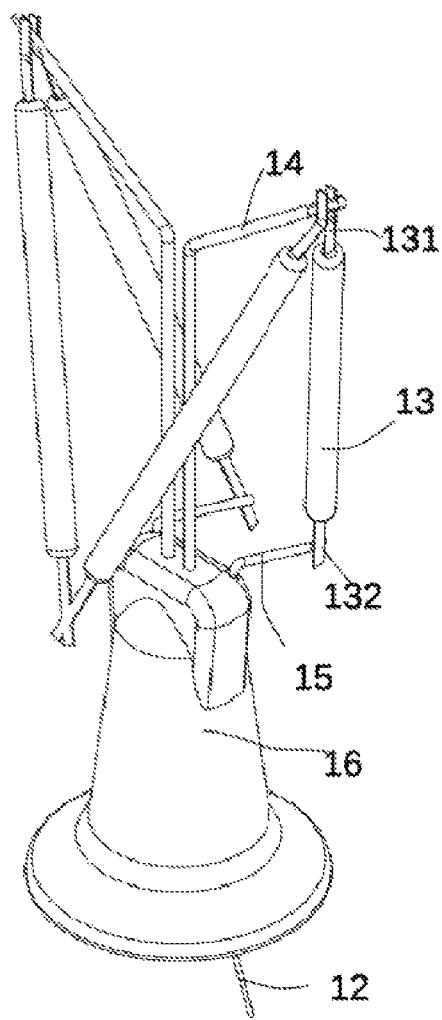
FIG. 1 illustrates major components of a light bulb embodiment.

In some embodiments, a LED bulb apparatus includes a bulb shell, a head cap, a driver circuit and at least one light strip. The bulb shell has a light passing shell and a bottom portion. The head cap has a neck portion, a first electrode and a second electrode. The neck portion of the head cap is connected to the bottom portion of the bulb shell forming a container space. The driver circuit is stored in the head cap for receiving an external power from the first electrode and the second electrode to generate a driving current.

At least one light strip has a substrate, a top end, a bottom end, and multiple LED modules mounted the substrate. A first fluorescent layer covers the multiple LED modules on a first side of the substrate. A second fluorescent layer covers a second side of the substrate.

The first side and the second side of the substrate are opposite. The driving current is transmitted via at least one of the top end and the bottom end of the light strip to the LED modules.

In some embodiments, the substrate of the light strip includes a ceramic layer.

In some embodiments, the light strip further includes at least one heat dissipation strip fixed to the substrate. The heat dissipation strip is heat conductive to the LED modules and electricity insulated from the LED module for carrying heat of the LED modules away from the LED modules.

In some embodiments, the second side of the substrate is mounted with another LED modules.

In some embodiments, only the first side of the substrate is mounted with the LED modules. A portion of light emitted by the LED modules from the first side of the substrate passes through the substrate and the second fluorescent layer.

In some embodiments, the substrate has a light transmittance less than 50%.

In some embodiments, the substrate has at least one through hole, the light of the LED modules passes through the through hole from the first side of the substrate to the second side of the substrate and then passes through the second fluorescent layer.

In some embodiments, a portion of the first fluorescent layer is extended into the through hole.

In some embodiments, a portion of the second fluorescent layer is extended into the through hole.

In some embodiments, there is a convex structure disposed in an inner wall of the through hole.

In some embodiments, the substrate has a hook structure protruding from a main surface of the substrate. The hook structure is penetrating into the first fluorescent layer.

In some embodiments, a lateral wall has a hook structure.

In some embodiments, the first fluorescent layer and the second fluorescent layer are connected wrapping the substrate.

In some embodiments, the first fluorescent layer has a larger thickness than the second fluorescent layer.

In some embodiments, a lateral side of the substrate is attached with anti-blue-light layer.

In some embodiments, the first fluorescent layer and the second fluorescent layer convert a light of the LED modules to output lights of different optical parameters.

In some embodiments, the container space is sealed to keep a heat dissipation air storing in the container space, the heat dissipation air including oxygen.

In some embodiments, the oxygen occupies 1% to 10% of the heat dissipation air.

In some embodiments, the oxygen occupies 3% to 8% of the heat dissipation air.

In some embodiments, the heat dissipation air includes Helium.

Figure 11:
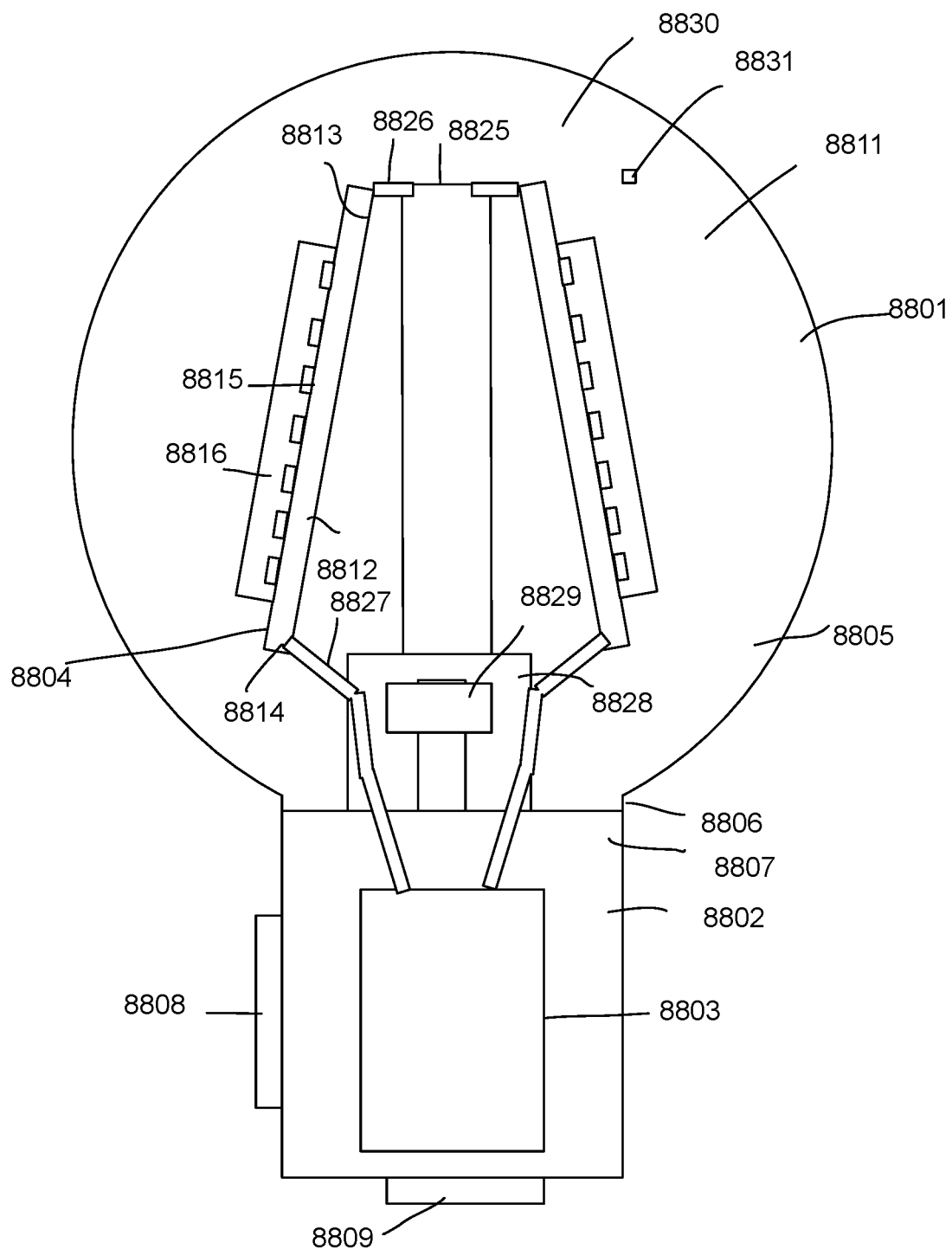
FIG. 11 illustrates a bulb embodiment.

In FIG. 11, a LED bulb apparatus has a bulb shell 8801, a head cap 8802, a driver circuit 8803 and at least one light strip 8804.

The bulb shell 8801 has a light passing shell 8805 and a bottom portion 8806. A head cap has a neck portion 8807, a first electrode 8808 and a second electrode 8809. The neck portion 8807 of the head cap 8802 is connected to the bottom portion 8806 of the bulb shell 8801 forming a container space 8811. The first electrode 8808 and the second electrode 8809 may be a lateral wall metal wall and a bottom metal pin in an Edison cap.

The driver circuit 8803 is stored in the head cap 8802 for receiving an external power from the first electrode 8808 and the second electrode 8809 to generate a driving current.

There may be one or multiple light strips 8804. Each light strip 8804 has a substrate 8812, a top end 8813, a bottom end 8814 and multiple LED modules 8815. The multiple LED modules 8815 are mounted on the substrate 8812. A fluorescent layer 8816 covers the multiple LED modules 8815. The driving current is transmitted via at least one of the top end 8813 and the bottom end 8814 of the light strip 8804 to the LED modules 8815. The substrate 8812 has a light transmittance less than 50%. Specifically, the substrate 8812 is not transparent. Light does not completely pass through the substrate or is completely blocked by the substrate. The substrate may be an elongated structure. In some embodiments, the substrate allows certain ratio of light to pass through, e.g. 20% to 30% light passing through the substrate.

In some embodiments, the substrate of the light strip includes a ceramic layer (not shown, indicating a component and material of the substrate). Specifically, the ceramic layer may be made of Al2O3 material, which has much better heat dissipation characteristic than common transparent material.

In some embodiments, the substrate is a flexible printed circuit board (not shown, indicating a component and material of the substrate) with copper material attached to increase heat dissipation effect. Blue gem layer may also be used in some embodiments. Soft aluminum strip may also be used forming the substrate in some embodiments.

Figure 18:
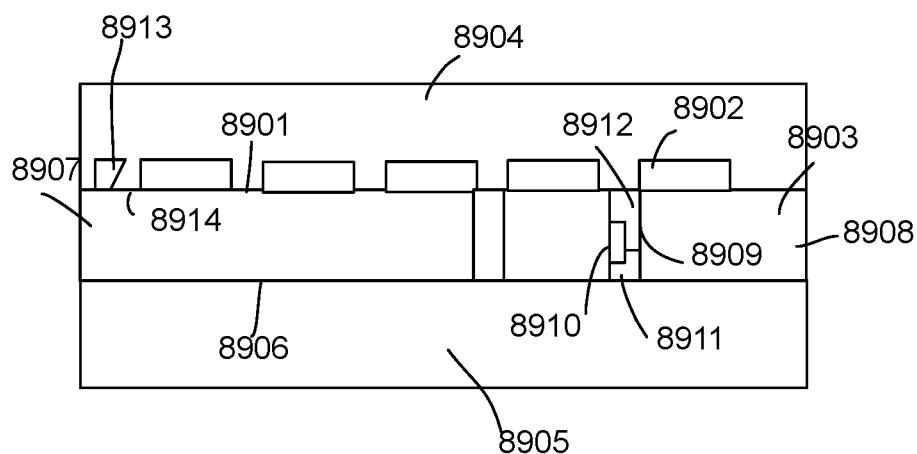
FIG. 18 shows a light strip structure.

In FIG. 18, a light strip embodiment is illustrated, which may be used in the embodiment of FIG. 11. Besides, some of the features in FIG. 11 may be removed, e.g. the light transmittance parameter.

In FIG. 18, the light strip example includes a substrate 8903, a top end 8907, a bottom end 8908. Multiple LED modules 8902 are mounted on the substrate.

A first fluorescent layer 8905 covers the multiple LED modules 8902 on a first side 8901 of the substrate 8903. A second fluorescent layer 8905 covers a second side 8906 of the substrate 8908.

The first side 8901 and the second side 8908 of the substrate are opposite. The driving current is transmitted via at least one of the top end and the bottom end of the light strip to the LED modules 8902.

In some embodiments, the substrate of the light strip includes a ceramic layer.

In some embodiments, the light strip further includes at least one heat dissipation strip fixed to the substrate. The heat dissipation strip is heat conductive to the LED modules and electricity insulated from the LED module for carrying heat of the LED modules away from the LED modules.

Figure 13:
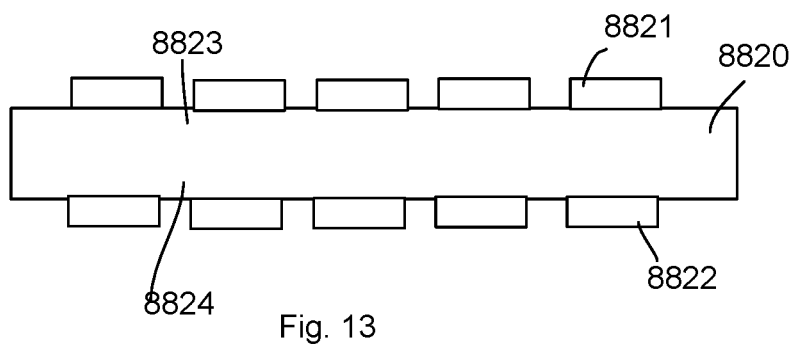
FIG. 13 illustrates a substrate with two sides mounted with LED modules.

In some embodiments, the second side of the substrate is mounted with another LED modules, as illustrated in FIG. 13.

In some embodiments, only the first side of the substrate is mounted with the LED modules like the example in FIG. 18. A portion of light emitted by the LED modules from the first side of the substrate passes through the substrate and the second fluorescent layer.

In some embodiments, the substrate has a light transmittance less than 50%.

In FIG. 18, the substrate has at least one through hole 8909, the light of the LED modules 8902 passes through the through hole 8909 from the first side of the substrate to the second side of the substrate and then passes through the second fluorescent layer.

In FIG. 18, a portion 8912 of the first fluorescent layer 8904 is extended into the through hole 8909.

In FIG. 18, a portion 8911 of the second fluorescent layer 8905 is extended into the through hole.

In FIG. 18, there is a convex structure 8910 disposed in an inner wall of the through hole 8909.

In some embodiments, the substrate 8908 has a hook structure 8913 protruding from a main surface 8914 of the substrate 8908. The hook structure 8913 is penetrating into the first fluorescent layer 8904.

Figure 19:
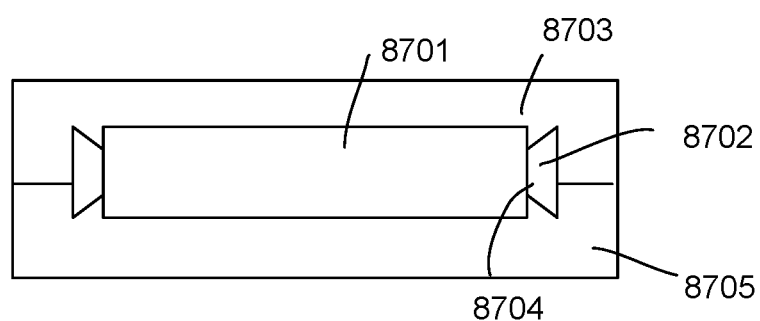
FIG. 19 shows a hook structure for fixing fluorescent layer.

In FIG. 19, a lateral wall 8704 of the substrate 8701 has a hook structure 8702. The hook structure 8702 may be a protruding structure, a concave structure or other structures that may enhance connection of the first fluorescent layer 8703, the second fluorescent layer 8705 and the substrate 8701.

In FIG. 19, the first fluorescent layer 8703 and the second fluorescent layer 8705 are connected wrapping the substrate 8701.

In some embodiments, the first fluorescent layer 8703 may have a larger thickness than the second fluorescent layer 8705. Most of light are emitted via the first fluorescent layer 8703. In some cases, still some light passes through the substrate 8701 and enters the second fluorescent layer 8705.

Figure 20:
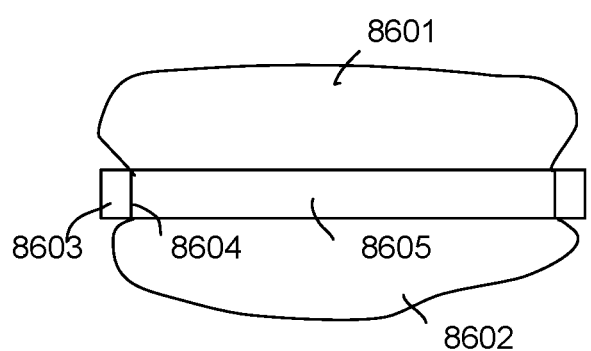
FIG. 20 shows an example when a lateral wall of the substrate is not covered by fluorescent layer.

FIG. 20 shows an example when a lateral wall 8604 of the substrate 8605 is not covered by any of the first fluorescent layer 8601 and the second fluorescent layer 8602. Specifically, in the example of FIG. 19, the example in FIG. 20 shows another design by exposing the lateral wall 8604 of the substrate 8605 without covering the lateral wall of the substrate 8605.

In FIG. 20, a lateral side 8604 of the substrate 8605 is attached with anti-blue-light layer 8603. The anti-blue-light layer 8603 includes material that filters certain blue light to protect human eyes. The material may include blue light absorbers which are made of combinations of different chemicals like yellow solvent dye. For example, the material in U.S. Pat. No. 8,262,947 or other material known by persons in the field.

In some embodiments, the first fluorescent layer and the second fluorescent layer convert a light of the LED modules to output lights of different optical parameters.

Figure 12:
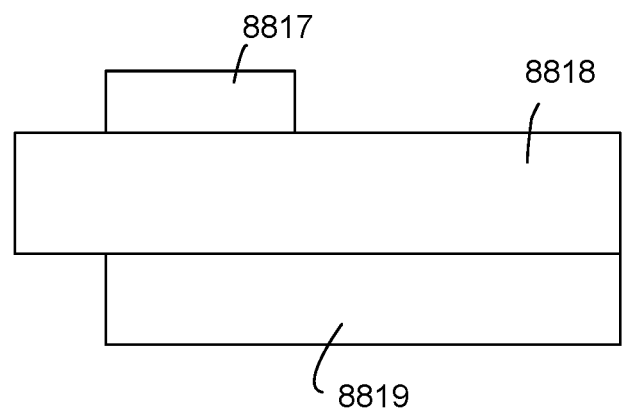
FIG. 12 illustrates a heat dissipation strip example.

In FIG. 12, the light strip further including at least one heat dissipation strip 8819 fixed to the substrate 8818, the heat dissipation strip 8819 is heat conductive to the LED modules 8817 and electricity insulated from the LED module 8817 for carrying heat of the LED modules 8817 away from the LED modules 8817.

In some embodiments, the substrate of the light strip includes a translucent glass layer (not shown, indicating a component and material of the substrate).

In some embodiments, the substrate of the light strip includes a graphene layer (not shown, indicating a component and material of the substrate).

In FIG. 13, the substrate 8820 has a top side 8823 and a bottom side 8824. The top side 8823 and the bottom side 8824 are respectively mounted with LED modules 8821, 8822. Specifically, one light strip has two sides of light sources for emitting light from both sides in such embodiments.

In FIG. 13, the LED modules 8821 on the top side of the substrate may have a different color temperature as the color temperature of the LED modules 8822 on the bottom side of the substrate. The color temperatures of two sides of a light strip are different makes the light strip bringing a richer visual effect better than single color temperature.

In FIG. 11, the LED bulb apparatus may also include a central column 8825 supporting multiple light strips 8804. There may be supporting metal strips 8826, 8827 for fixing the light strip 8804 to expand the light strip in a desired position to adjust light emitting pattern.

In some embodiments, the central column is made of transparent material, e.g. glass or transparent plastic material.

In FIG. 11, the LED bulb apparatus may also include a base part 8828. The central column 8825 is extended from the base part 8828. The base part 8828 has an air passage 8829 for filling the heat dissipation air 8811 into the container space 8811 before the air passage 8829 is sealed for forming the container space 8811 together with the bulb shell 8801.

In FIG. 11, the container space 8811 is sealed to keep a heat dissipation air 8830 storing in the container space. The heat dissipation air 8830 including oxygen.

In some embodiments, the oxygen occupies 1% to 10% of the heat dissipation air 8830, e.g. mole number or weight of the oxygen relative to overall heat dissipation air.

In some embodiments, the oxygen occupies 3% to 8% of the heat dissipation air.

In some embodiments, the heat dissipation air 8830 includes sparkling particles 8831 flowing within the container space 8811 when heat of the LED modules 8815 heats the heat dissipation air 8830. Such sparkling particles 8831 add visual effect of the light bulb. Such sparkling particles 8831 may be made of small particles with reflective appearance easily floating and moving in the container space. Heat of the LED modules makes air flowing in the container space and brings the sparkling particles to move around.

In some embodiments, the heat dissipation air 8830 includes Helium.

Figure 14A:
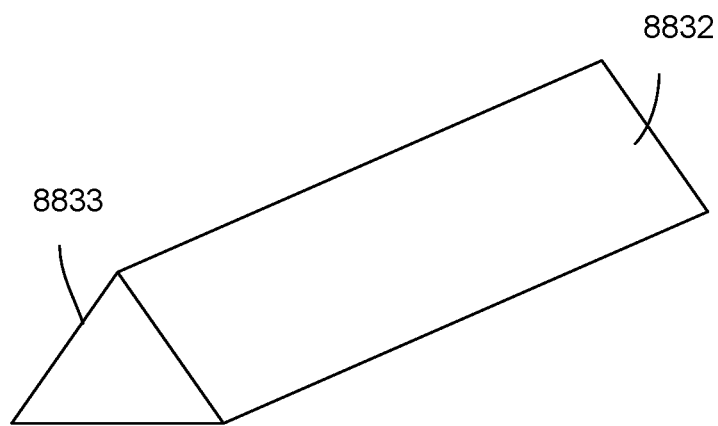
FIG. 14A shows a prism structure substrate.

In FIG. 14A, the substrate is a prism structure with a first side 8832 and a second side 8833 for respectively mounting the LED modules. The first side 8832 and the second side 8833 have a tilt angle between 20 degrees to 160 degrees.

Figure 14B:
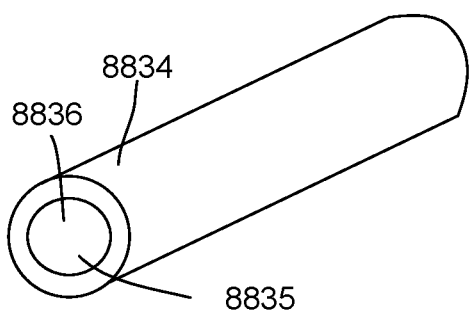
FIG. 14B shows a tubular structure substrate.

In FIG. 14B, the substrate is a tube structure 8834 with an inner space 8835.

In some embodiments, a heat dissipation material 8836 is filled in the inner space 8835 of the substrate.

In some embodiments, the LED modules have multiple types having different optical parameters for mixing a mixed optical parameter controlled by the driver circuit. This not shown in the drawings because the LED modules are shown in drawings and it is known to persons of ordinary skilled in the art that the types of the LED modules may be varied and placed on the same substrate.

In some embodiments, the LED modules are electrically connected forming an inverted LED path having two ends terminals on only one of the top end and the bottom end. With such design, it is easier to connect multiple light strips to form a parallel connection, a series connection, a hybrid connection because only ends, either on the top ends or on the bottom ends are necessary to transmit electricity to the LED modules on the light strips.

Figure 15:
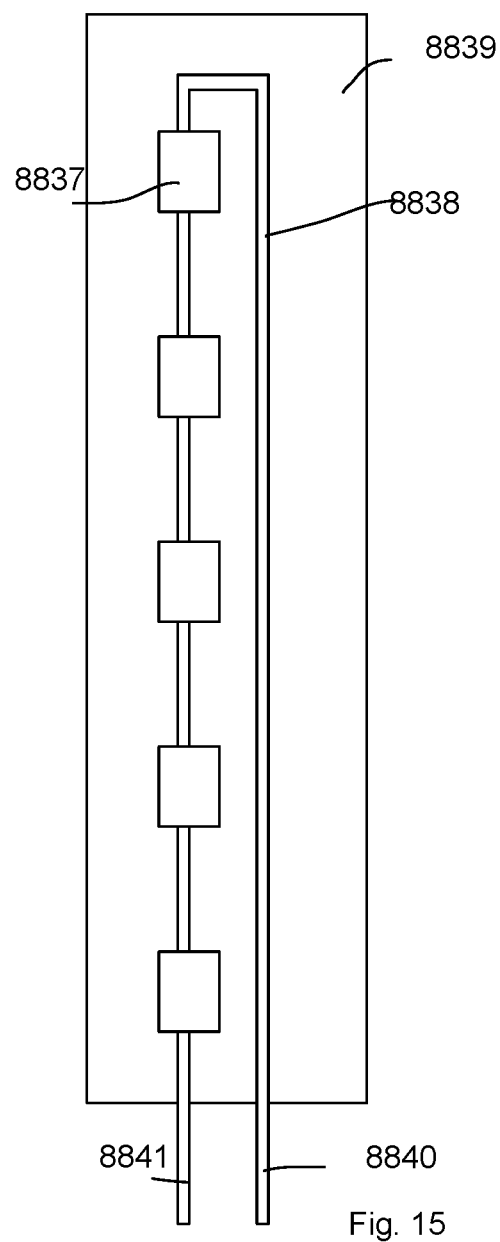
FIG. 15 shows an inverted LED path.

For example, in FIG. 15, LED modules 8837 on a substrate 8839 are connected with a conductive path 8838 forming an inverted LED path which two end terminals 8840, 8841 are on the top end or the bottom end of the light strip.

Figure 16:
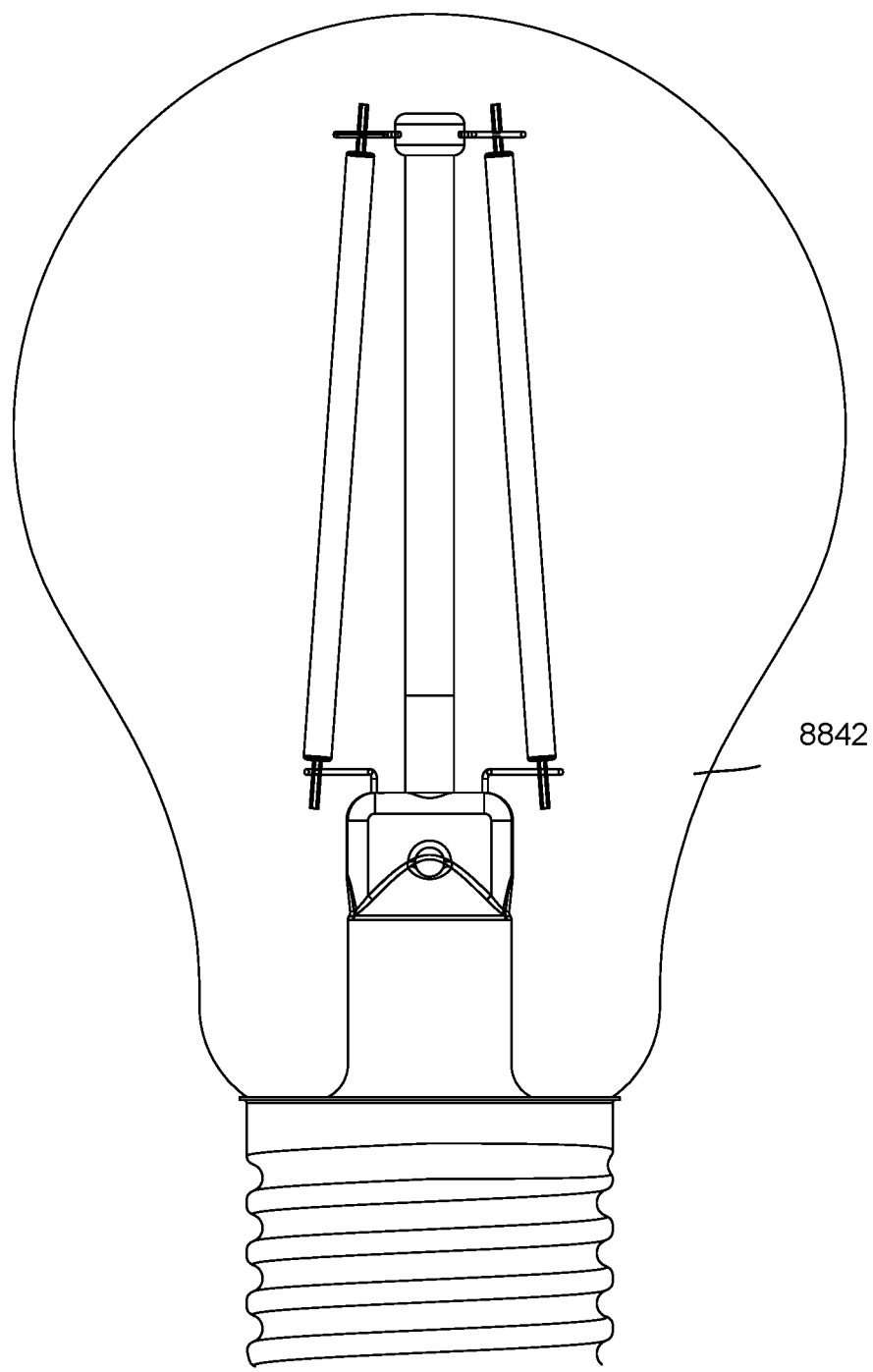
FIG. 16 shows a bulb shell shape.
Figure 17:
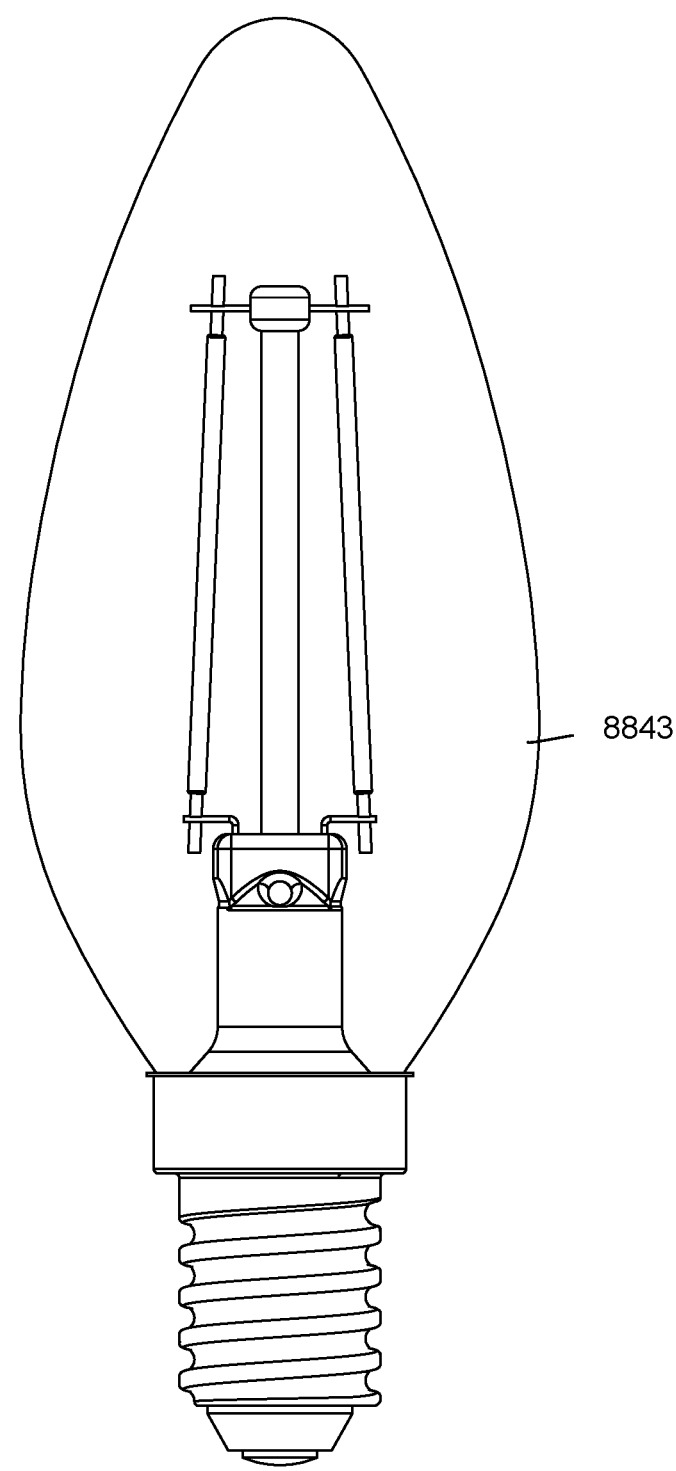
FIG. 17 shows another bulb shell shape.

In FIG. 16, the bulb shell 8842 has a first shape. In FIG. 17, the bulb shell 8843 has another shape. In other words, the invention may be applied in different types of light bulbs.

According to an embodiment of the present invention, a light bulb apparatus has a head cup, a bottom support, multiple light strips and a bulb shell.

The head cup is designed to be connected to an external power source, e.g. complying with various Edison bulb cap standards. The head cup also has a containing space for storing a driver circuit for converting external power source to proper driving current to drive the LED components of the light apparatus.

The bottom support is connected and extended from the head cup. Parts of the bottom support are made of glass material. To provide better heat dissipation, heat dissipation air may be introduced into the bulb apparatus. In such case, the glass part of the bottom support may have a through hole to letting heat dissipation air into the bulb apparatus and then sealed during manufacturing.

The bottom support may be integrated with the bulb shell when they are both made of glass material. In addition to the glass part, there may be other material to form other parts of the bottom support.

The multiple light strips are mounted with LED modules. The LED modules may have different color temperatures and mixed to form a desired color temperature. In addition, the driver circuit may be configured to change luminous level of the LED modules, e.g. changing driving currents supplied to the LED modules.

In some embodiments, the LED modules have different types of LED modules with different color temperatures. The driver circuit may be configured to provide different driving current to different types of the LED modules so that when the LED are turned brighter, the mixed color temperature is more like a day light and when the LED are turned less brighter, the mixed color temperature is more like color temperature during sunset.

Each light strip has a top end and a bottom end. The bottom ends of the light strips are connected to the bottom support for being electrically connected to the driver circuit. In other words, the driver circuit provides driving current to the light strips via components of the bottom support, e.g. some metal bars or strips.

The top ends of the light strips form a top polygonal shape, and the bottom ends of the light strips form a bottom polygonal shape. The bottom polygonal shape has a bigger area size than the top polygonal shape. Since each light strip has a top end and a bottom end, the top polygonal shape may be geometrically similar, in some case, to the bottom polygonal shape. For example, the top polygonal shape and the bottom polygonal shape are both hexagonal shapes, just with different area sizes.

Each light strip has a skewed angle with respect to a middle axis perpendicular to the bottom polygonal shape. The middle axis is a virtual axis perpendicular to the bottom polygonal shape and extends from the middle of the bottom polygonal shape. The light strips surround the middle axis and are skewed with a skewed angle so that their projection are still not parallel to the middle axis.

The bulb shell is extended from the head cup covering the bottom support and the plurality of light strips.

In some embodiments, the bulb apparatus may further have a central support. The central support has a bottom part connected to the bottom support and having a top part connected to the top ends of the plurality of the light strips.

In some embodiments, the central support is a vertical bar that has its bottom part connected to the bottom support and its top part connecting to the top ends of the multiple light strips.

In some embodiments, the vertical bar has a metal top portion and an insulation middle portion. The insulation middle portion may be made of transparent plastic material or glass material to have a better appearance.

In some embodiments, the vertical bar has a metal part embedded in a glass portion of the bottom support. This may be implemented by placing the metal part in a molding device and then covered with fluid heated glass. After the glass is cooled, the metal part is sealed in the bottom support.

In some embodiments, the vertical bar is a tube. Such method reduces material usage and saves cost while keeping rigidity of the vertical bar.

In some embodiments, the vertical bar is an elongated folded metal sheet. In other words, an elongated sheet is folded to increase its rigidity.

In some embodiments, the vertical bar is metal material and has one more fins to help heat dissipation.

In some embodiments, the light bulb apparatus may further include a bracket for connecting the top ends of the light trips to the vertical bar.

The bracket may have multiple metal bars, or in other way, e.g. a circle shape with a bar connected to the vertical bar.

In some cases, the bracket has multiple metal bars and parts of the metal bars are welded to the vertical bar.

In some embodiments, the bracket may have multiple metal bars, parts of the metal bars are embedded to a glass portion of the vertical bar. Like what being explained above, when the vertical bar is made of glass material, parts of the bracket may be placed in a molding device and filled with fluid heated glass material. When the glass material is cooled down, the bracket is fixed to the vertical bar.

In some embodiments, the top end of the light strip has a metal portion extended from a substrate of the light strip. In such case, the light strip is made of a substrate mounted with LED modules that are further covered by fluorescent material. The substrate has a metal part and the metal part is extended to the top end of the light strip. In other words, the top end and the substrate of the light strip is one piece, which may be cut from a metal sheet.

The top ends of the light strips may be folded to keep the light strip with a distance from the vertical bar.

In some cases, two light strips are made together and form a pair. In such pair, the two light strips share the same metal material and thus their top ends are two portion of a one piece material. In such case, the connection between the two light strips has better electricity conductivity and may decrease unnecessary heat due to resistance of the connected portion between the two light strips.

Therefore, in a light bulb apparatus of such case, if there are six light strips, there are three pairs of light strips placed in the bulb apparatus, instead of fixing six independent light strips together, which may also decrease manufacturing time and difficulty.

In some embodiments, a connection part of the top ends of the two light strips surrounds the vertical bar. For example, the top ends of two light strips are welded together while leaving a hole in the middle of the connection. The vertical bar is placed in the middle of the connection, thus increasing robustness of overall light bulb structure.

In some embodiments, the top ends of the light strips are separately connected to a bracket and the bracket enables electrical connection between the two ends of the light strips. For example, the bracket may have multiple metal bars as mentioned above. The top ends of the light strips are separately welded to the metal bars. With the metal bar as an intermediate component, the light strips may be connected in desired connection manner, e.g. connected in series or in parallel.

Usually, the light strips have a major light emitting angle, e.g. 120 degrees. The central direction of the light emitting span is named as the major light direction.

In some embodiments, the major light directions of the light strips lean toward the bottom support. Specifically, the major light directions are directed to lower portion, instead of top portion, of the light bulb apparatus, i.e. more close to the bottom support instead of close to the top ends of the light strips.

To further enhance overall light pattern, the major light directions of the light strips also lean toward dark part of neighbor light strips. For example, the major direction of one light strip is directed to dark part, out of main light angle span area, of a neighbor light strip.

In some embodiments, there are more than one vertical bars for the central support. To increase the top polygonal shape of the light bulb apparatus, the top parts of these vertical bars are bent and connected to the top ends of the light strips.

FIG. 1 illustrates major components of a light bulb embodiment.

The above LED module may be embedded into a bulb with Edison bulb head to be mounted on standard Edison bulb socket. The LED module includes a bottom support 16, with conductive wires 12 inside to connect to power supply. Two or more LED strips 13 are mounted on a central support 14. Each LED bar 13 has a substrate plate extending two leads 131 as top end, 132 as bottom end which are connected to the central support 14 and the conductive wire 15, respectively. In this example, the LED strips 13 are connected in series, and the central support is not directly connecting to any power supply. The central support may be made of metal materials. Transparent materials may also be used under different design requirements.

A transparent or translucent bulb cover made of glass or other material may be used for enclosing the LED module. While a translucent, not 100% transparent cover, is used, the arrangement of the LED bars may form visible dark/light strips on its surface.

Figure 2:
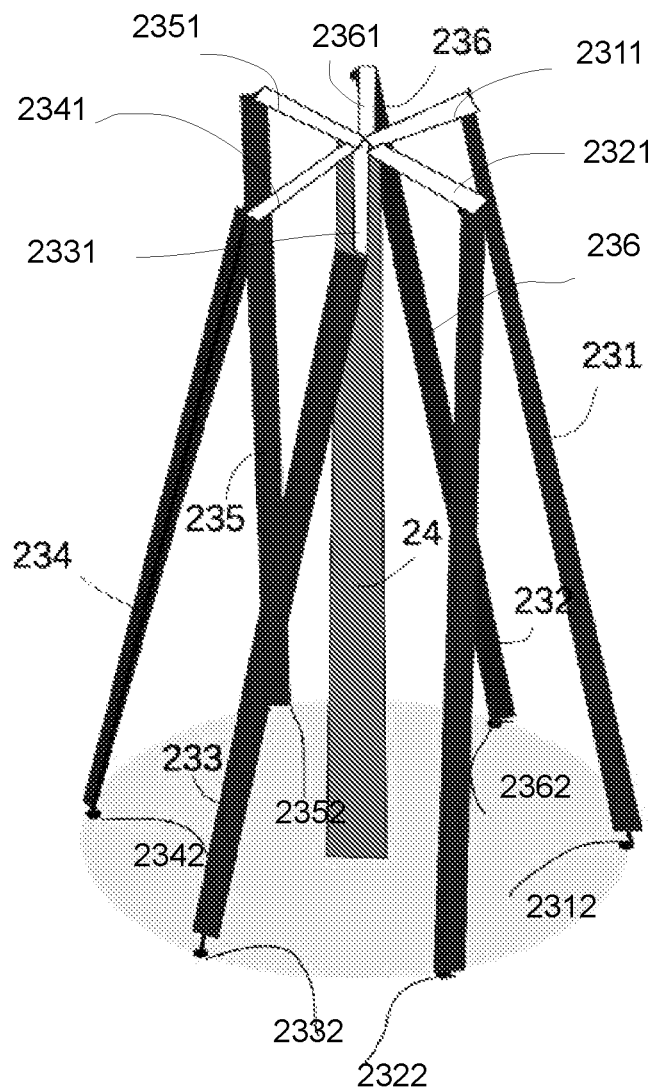
FIG. 2 illustrates how the light strips are skewed.

FIG. 2 illustrates how the light strips are skewed.

In this example, three pairs of LED strips 231, 232, 233, 234, 235, 236 are connected to a central support 24. Each LED bar 231, 232, 233, 234, 235, 236 is rotated with an angle so that they are not standing vertically with respect to the central support 24. In addition, each LED bar 231, 232, 233, 234, 235, 236 has its major illuminant angle facing downwardly and pointing to a neighbor LED bar so that the shadow or bright part projected onto a translucent bulb cover may be eliminated. The central support may be made of metal or glass or other materials.

In this example, the top ends 2311, 2321, 2331, 2341, 2351, 2361 of the light strips 231, 232, 233, 234, 235, 236 form a top polygonal shape, and the bottom ends 2312, 2322, 2332, 2342, 2352, 2362 form a bottom polygonal shape.

The top polygonal shape and the bottom polygonal shape are similar but has a shifted angled, or say a skewed angle between them.

Figure 3A:
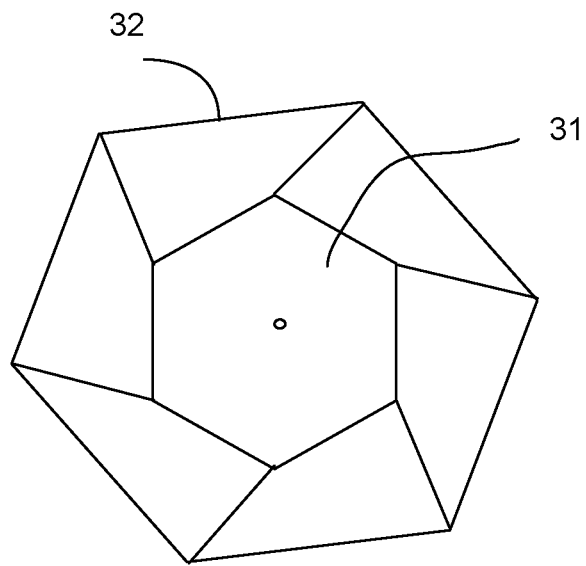
FIG. 3A illustrates the relation between the top polygonal shape and the bottom polygonal shape in an embodiment.

FIG. 3A illustrates the relation between the top polygonal shape and the bottom polygonal shape in an embodiment.

Figure 3B:
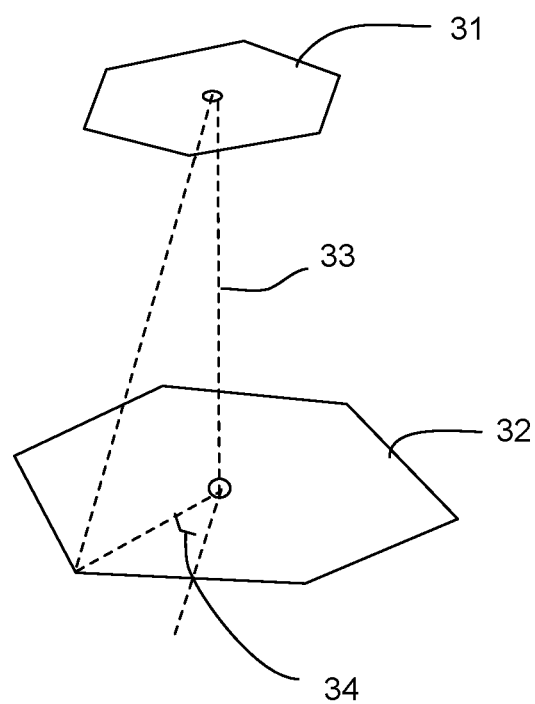
FIG. 3B illustrates a perspective view of FIG. 3A.

FIG. 3B illustrates a perspective view of FIG. 3A.

In FIG. 3A, from a top view, it is illustrated that the top polygonal shape 31 is similar to the bottom polygonal shape 32, and there is a skewed angle between the top polygonal shape 31 and the bottom polygonal shape 32.

In FIG. 3B, from a perspective view, the middle points of the top polygonal shape 31 and the bottom polygonal shape 32 form a virtual middle axis 33. There are various ways to define the skew angle of each light strip. In this case, the skew angle of each light strip with respect to the middle axis may be referred to an equivalent measure, i.e. the angle 34.

Figure 4:
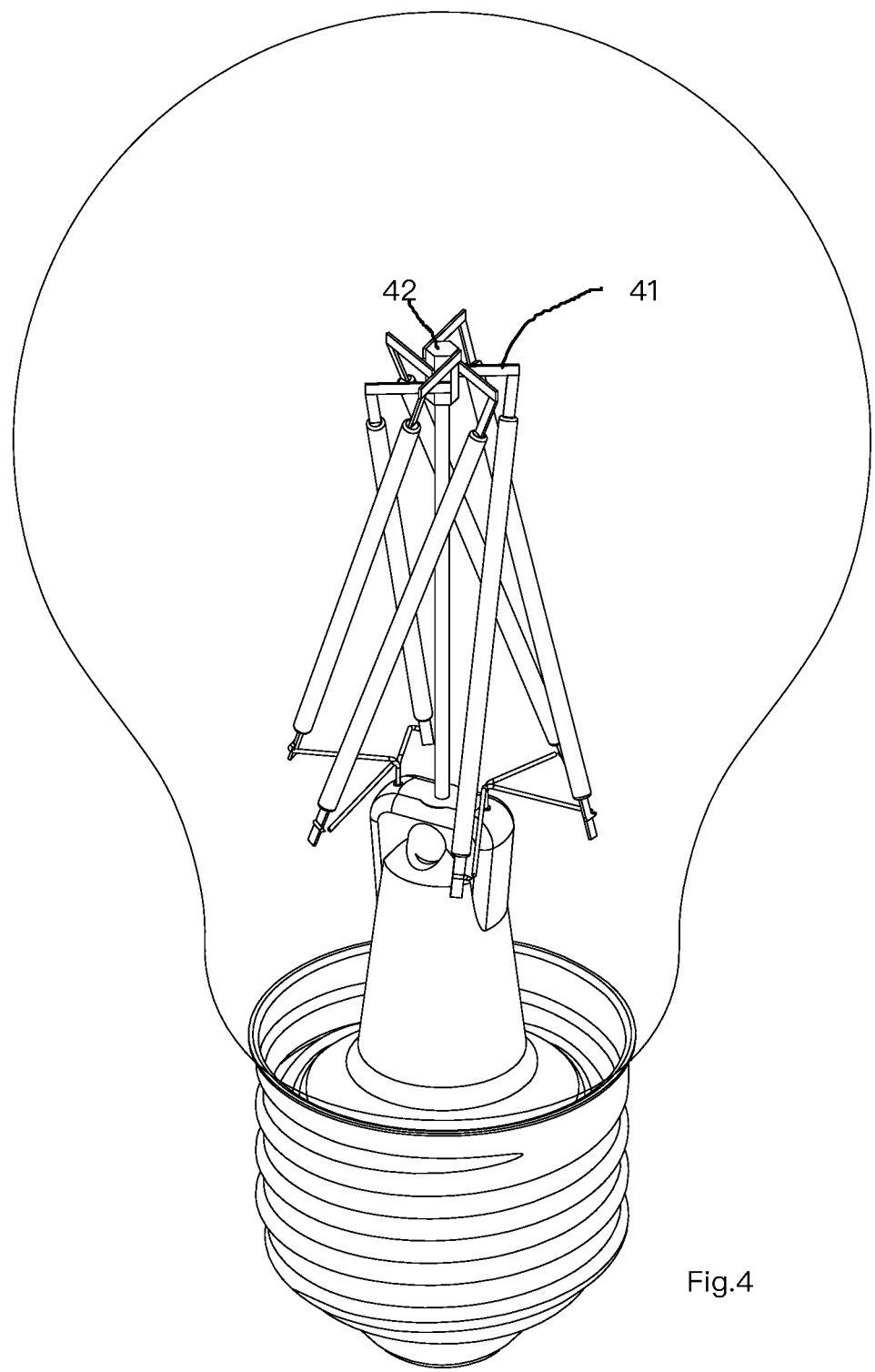
FIG. 4 illustrates an embodiment of a light bulb apparatus.

FIG. 4 illustrates an embodiment of a light bulb apparatus.

In this example, the top ends 41 have a folded portion connected to the central support 42.

Figure 5:
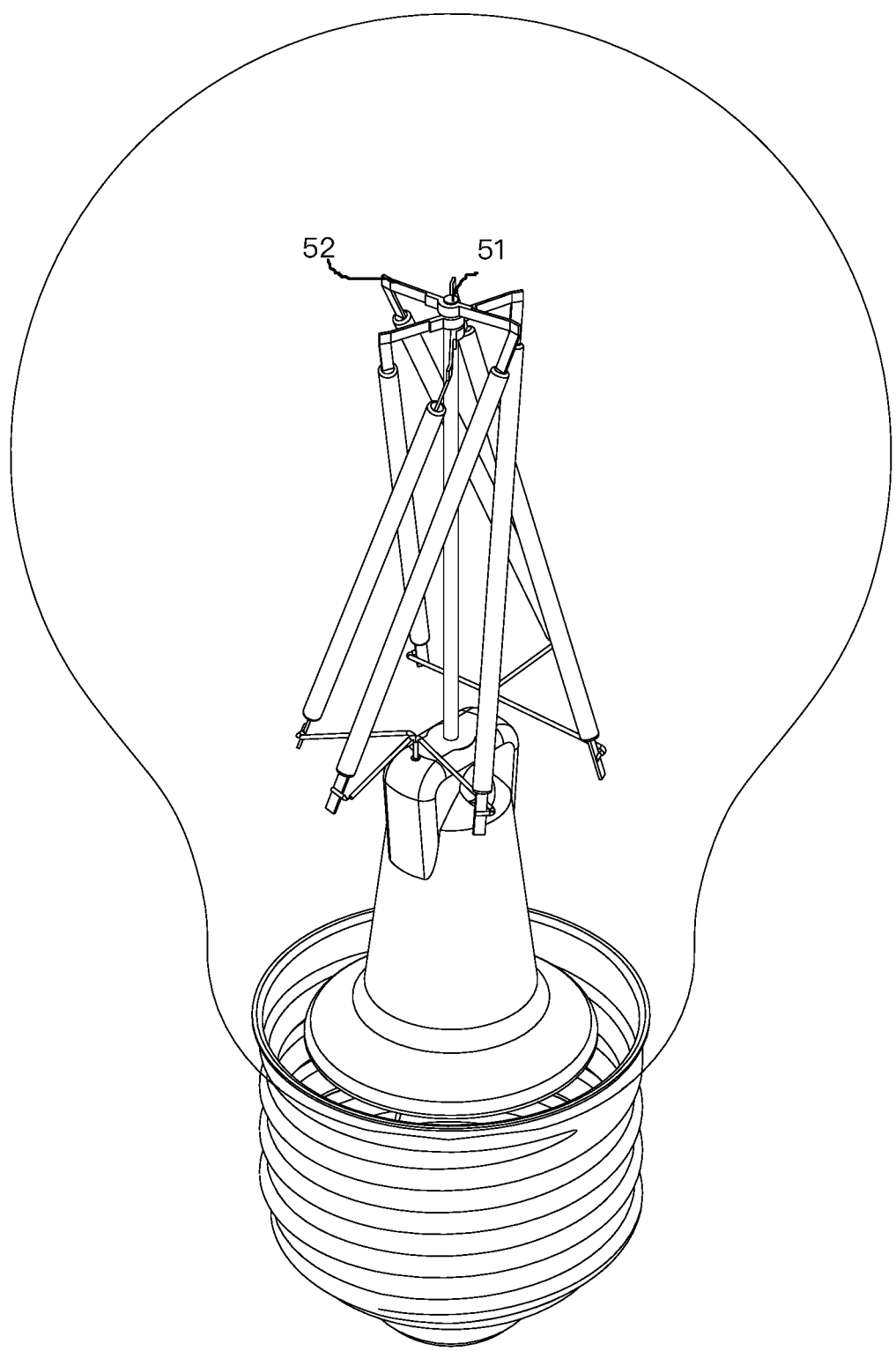
FIG. 5 illustrates another embodiment of a light bulb apparatus.

FIG. 5 illustrates another embodiment of a light bulb apparatus.

In this example, unlike FIG. 4, the connection of top ends of two light strips 52 surrounds the central support 51.

Figure 6:
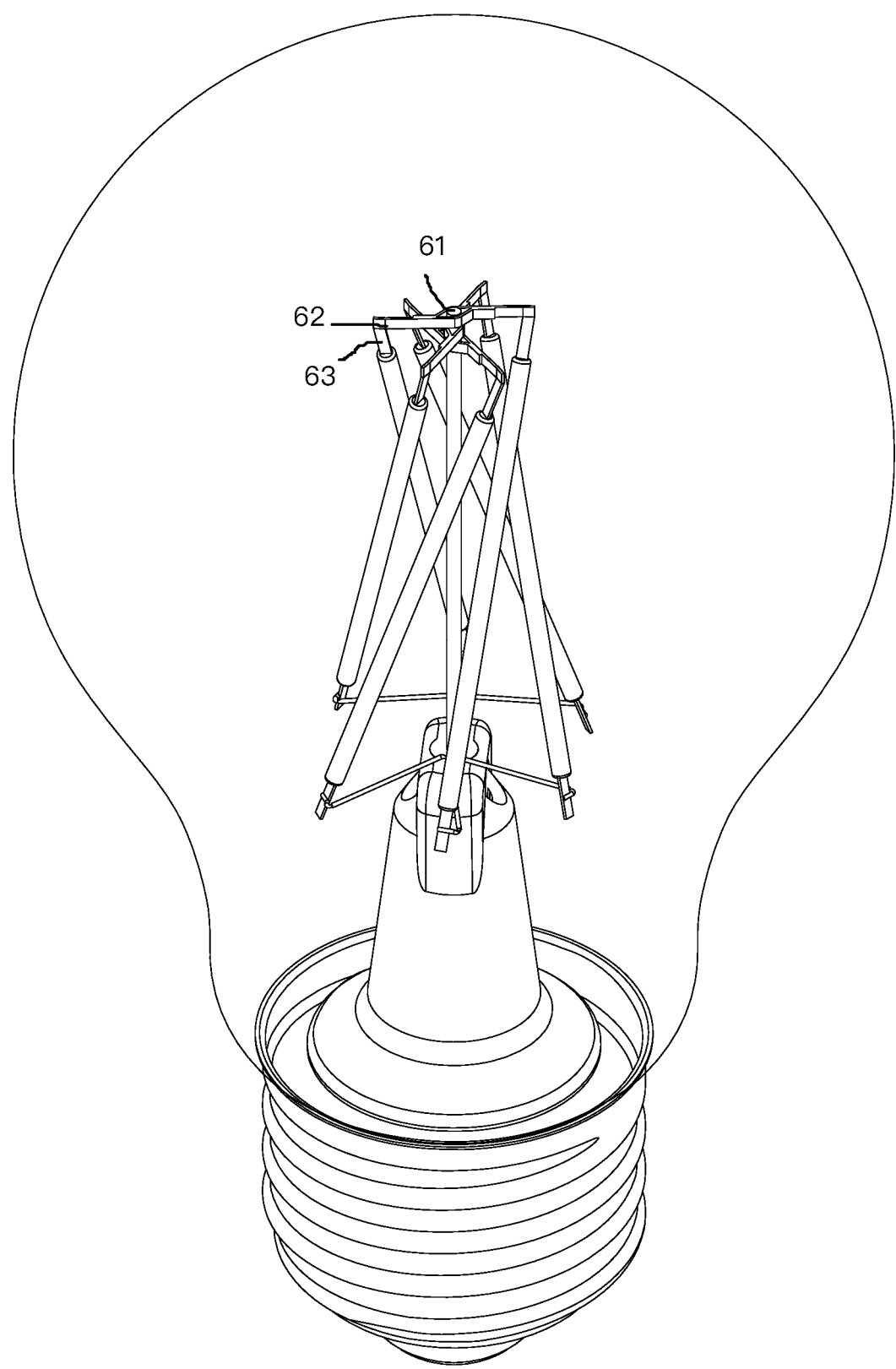
FIG. 6 illustrates another embodiment of a light bulb apparatus.

FIG. 6 illustrates another embodiment of a light bulb apparatus.

In this example, there is a bracket 62 connected to the central support 61, and the top end 63 of a light strip is connected to the central support 61 via the bracket 62.

Figure 7A:
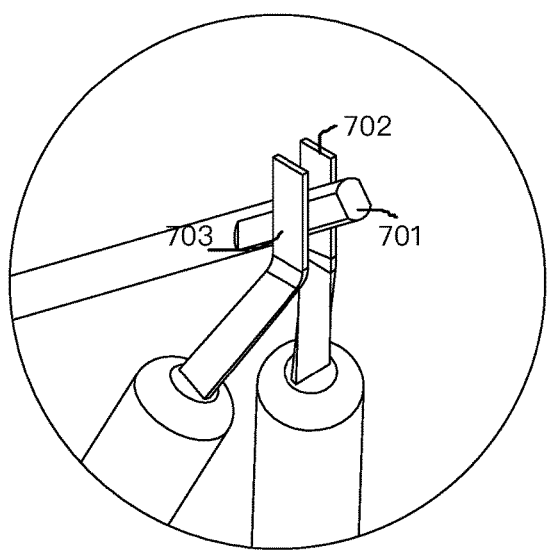
FIG. 7A illustrates a connection manner at top ends of light strips in an embodiment.

FIG. 7A illustrates a connection manner at top ends of light strips in an embodiment.

In this example, a bracket 701 is extended from the central support, and top ends 702, 703 are welded to two sides of the bracket 701.

Figure 7B:
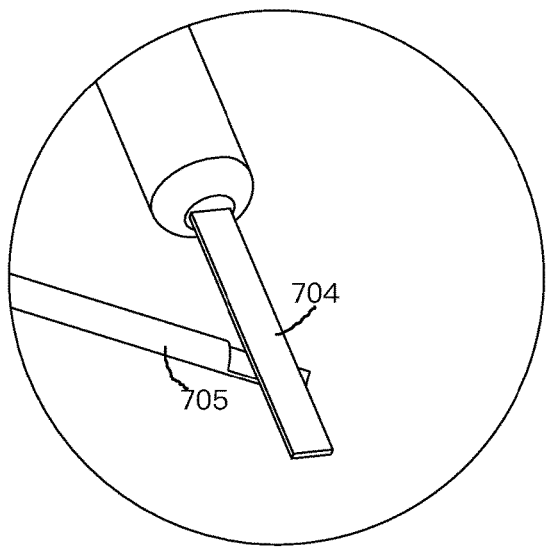
FIG. 7B illustrates another connection manner at top ends of light strips in an embodiment.

FIG. 7B illustrates another connection manner at top ends of light strips in an embodiment.

In this example, a bottom end 704 is welded to a metal bar 705 of the bottom support.

Figure 7C:
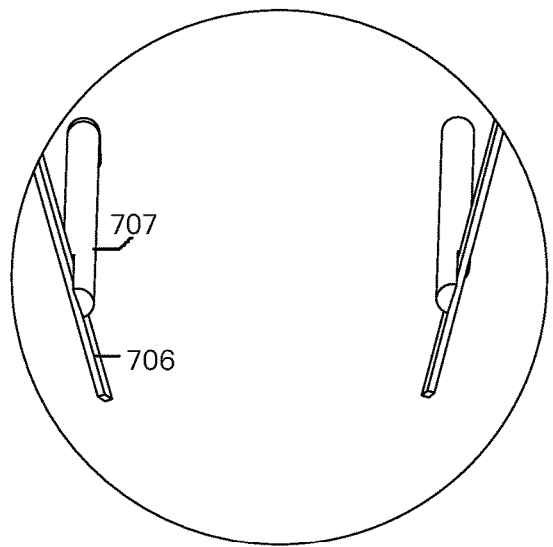
FIG. 7C illustrates another connection manner at top ends of light strips in an embodiment.

FIG. 7C illustrates another connection manner at top ends of light strips in an embodiment.

In this example, there is a flatten surface between a top end 706 and a bracket 707.

Figure 7D:
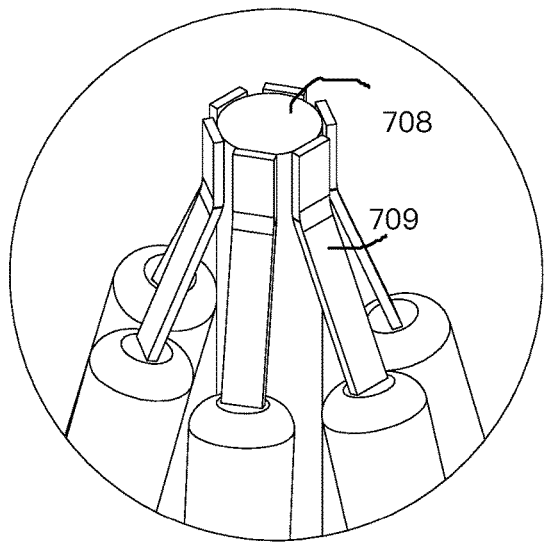
FIG. 7D illustrates another connection manner at top ends of light strips in an embodiment.

FIG. 7D illustrates another connection manner at top ends of light strips in an embodiment.

In this example, the top end 709 is bent and connected to the central support 708.

Figure 7E:
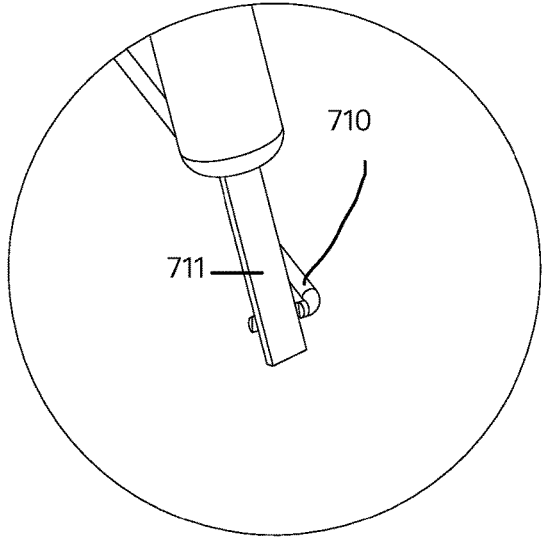
FIG. 7E illustrates another connection manner at top ends of light strips in an embodiment.

FIG. 7E illustrates another connection manner at top ends of light strips in an embodiment.

In this example, there is a bent portion in the bracket 710 for connecting to the top end 711 of a light strip.

Figure 7F:
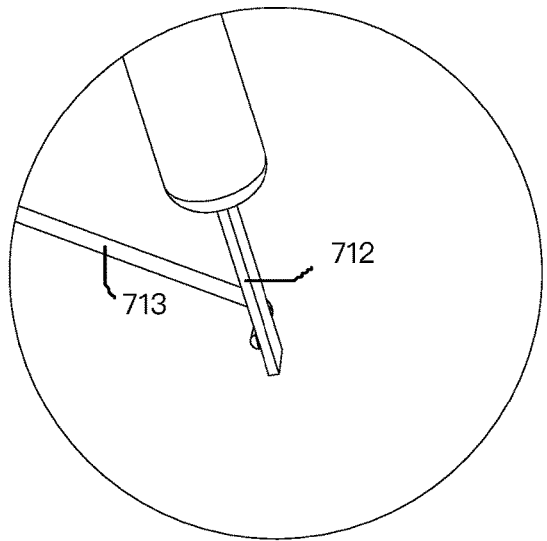
FIG. 7F illustrates another connection manner at top ends of light strips in an embodiment.

FIG. 7F illustrates another connection manner at top ends of light strips in an embodiment.

In this example, as another view angle of FIG. 7E, there is a bent portion in the bracket 713 for connecting to the top end 712 of a light strip.

Figure 7G:
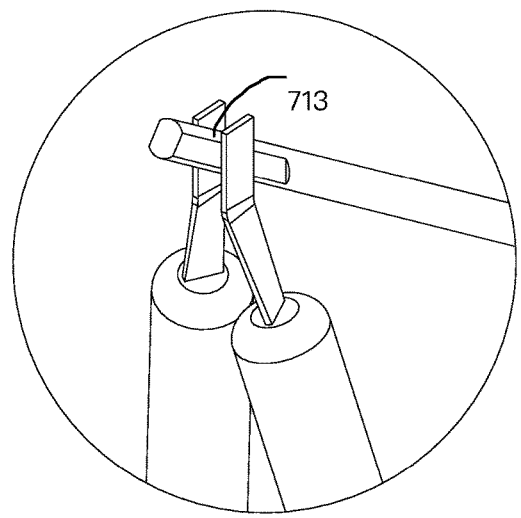
FIG. 7G illustrates another connection manner at top ends of light strips in an embodiment.

FIG. 7G illustrates another connection manner at top ends of light strips in an embodiment.

In FIG. 7G, it illustrates that there are flatten surface in the connection portion 713 of a bracket for connecting two strips in its two sides.

Figure 7I:
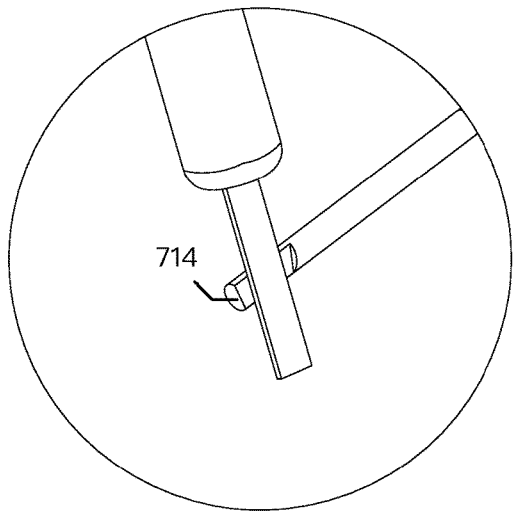
FIG. 7I illustrates another connection manner at top ends of light strips in an embodiment.

FIG. 7I illustrates another connection manner at top ends of light strips in an embodiment.

In this example, it illustrates a flatten surface exists in a metal wire 714 of a bottom support.

Figure 7J:
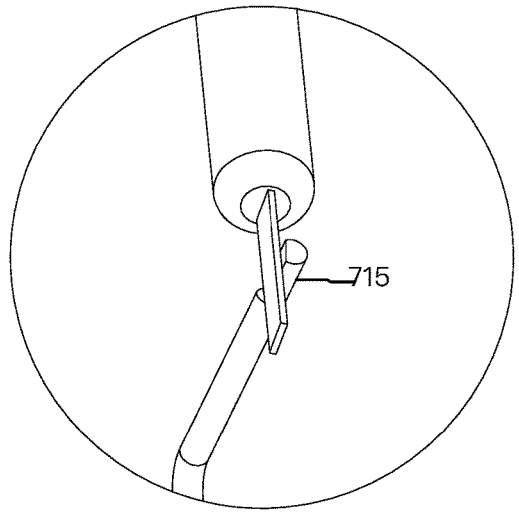
FIG. 7J illustrates another connection manner at top ends of light strips in an embodiment.

FIG. 7J illustrates another connection manner at top ends of light strips in an embodiment.

In this example, it illustrates a flatten surface in the connection portion of a bracket 715 corresponding to a flat surface of a top end of a light strip.

Figure 7K:
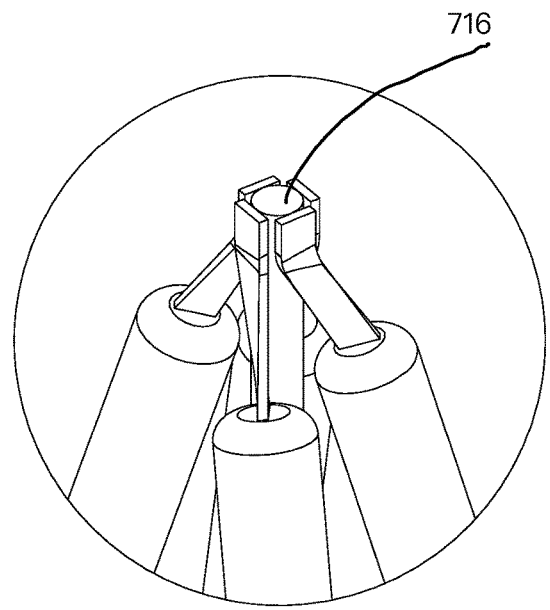
FIG. 7K illustrates another connection manner at top ends of light strips in an embodiment.

FIG. 7K illustrates another connection manner at top ends of light strips in an embodiment.

In this example, the central support 716 is surrounded by four light strips.

Figure 7L:
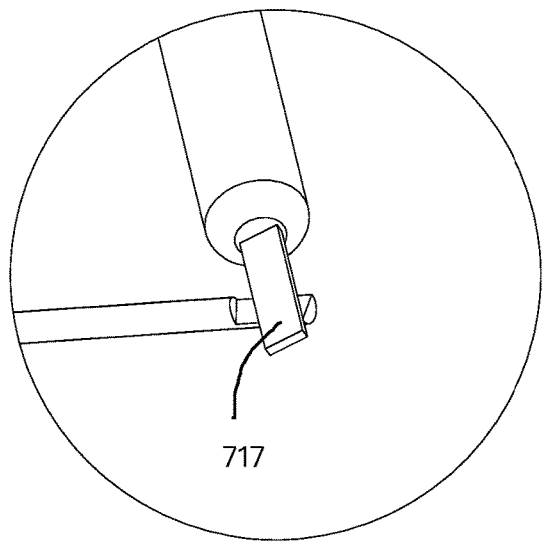
FIG. 7L illustrates another connection manner at top ends of light strips in an embodiment.

FIG. 7L illustrates another connection manner at top ends of light strips in an embodiment.

In this example, the bottom end 717 of a light strip is connected to a straight metal wire of a bottom support.

Figure 7H:
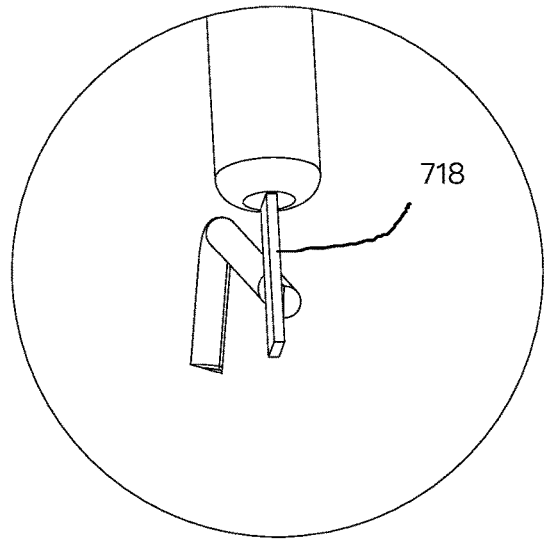
FIG. 7H illustrates another connection manner at top ends of light strips in an embodiment.

FIG. 7H illustrates another connection manner at top ends of light strips in an embodiment.

In this example, unlike FIG. 7L, there is a bent portion in the bracket to connect to the top end 718 of a light strip.

Figure 8A:
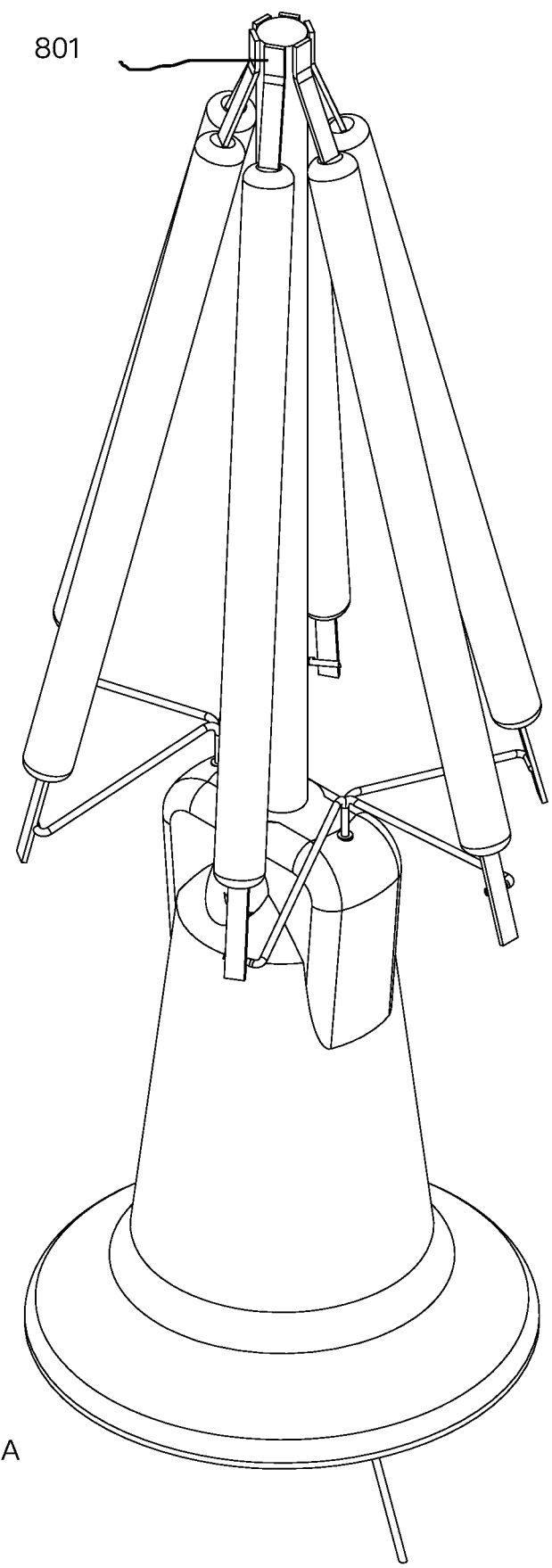
FIG. 8A illustrates another embodiment.
Figure 8B:
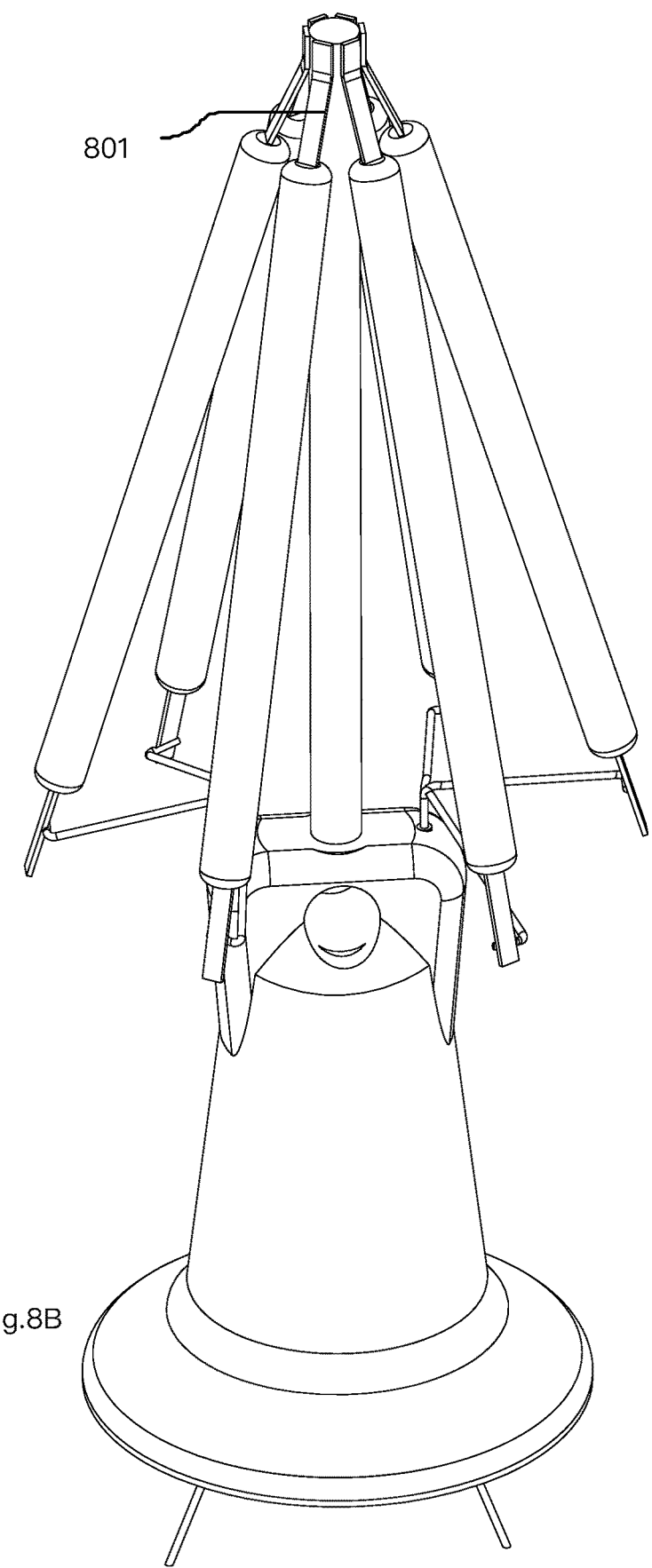
FIG. 8B illustrates the embodiment of FIG. 8A in another view angle.

FIG. 8A illustrates another embodiment. FIG. 8B illustrates the embodiment of FIG. 8A in another view angle.

Figure 8C:
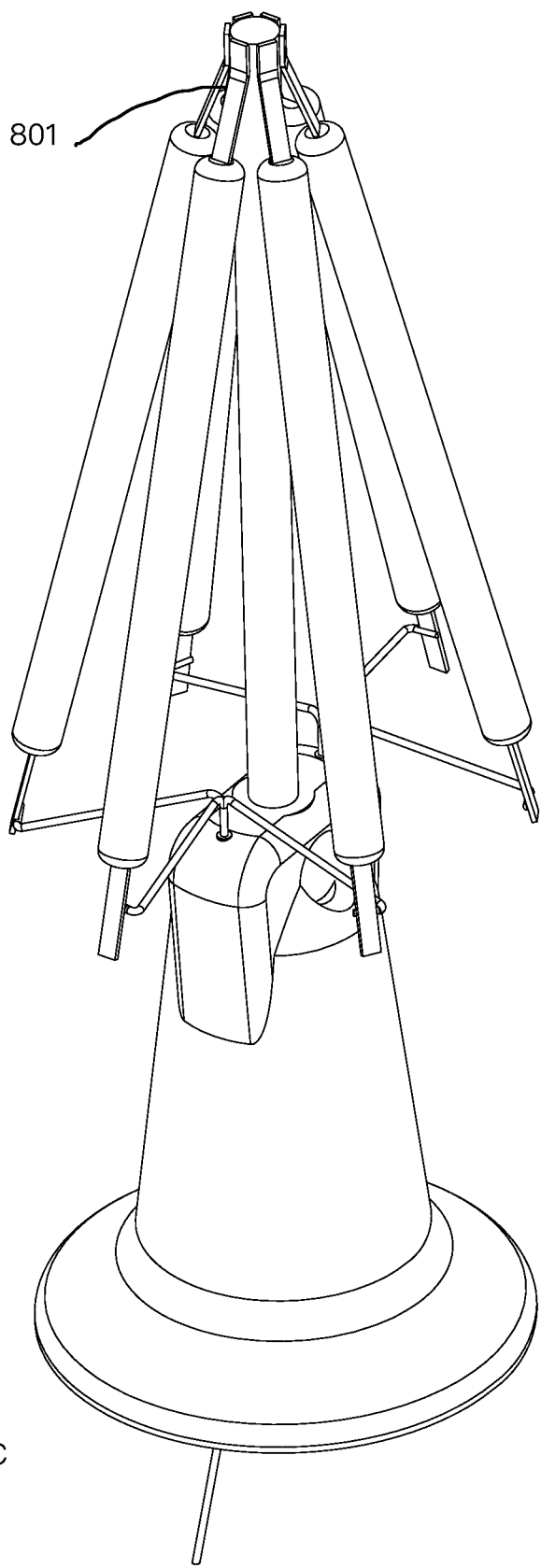
FIG. 8C illustrates the embodiment of FIG. 8A in another view angle.

In FIG. 8A, FIG. 8B and FIG. 8C, the central support 801 is surrounded by six light strips. In this example, there is no skewed angle for the light strip.

Figure 9A:
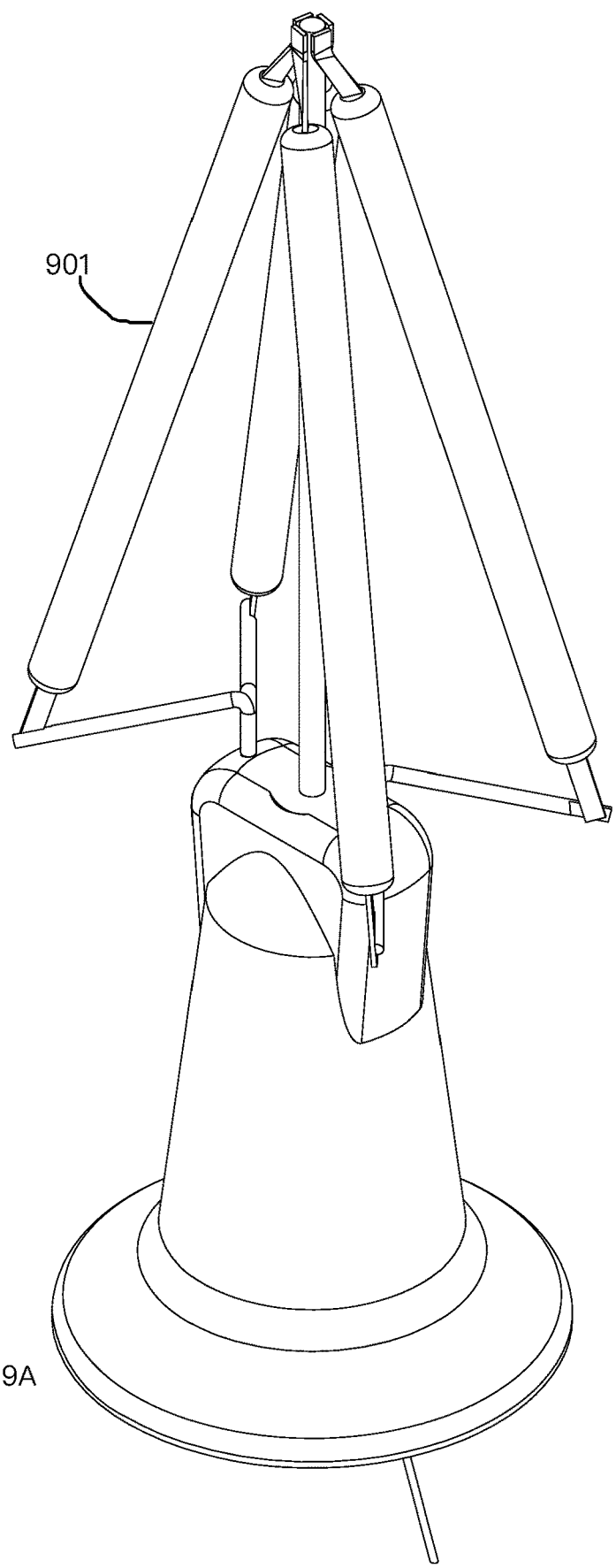
FIG. 9A illustrates another embodiment.
Figure 9B:
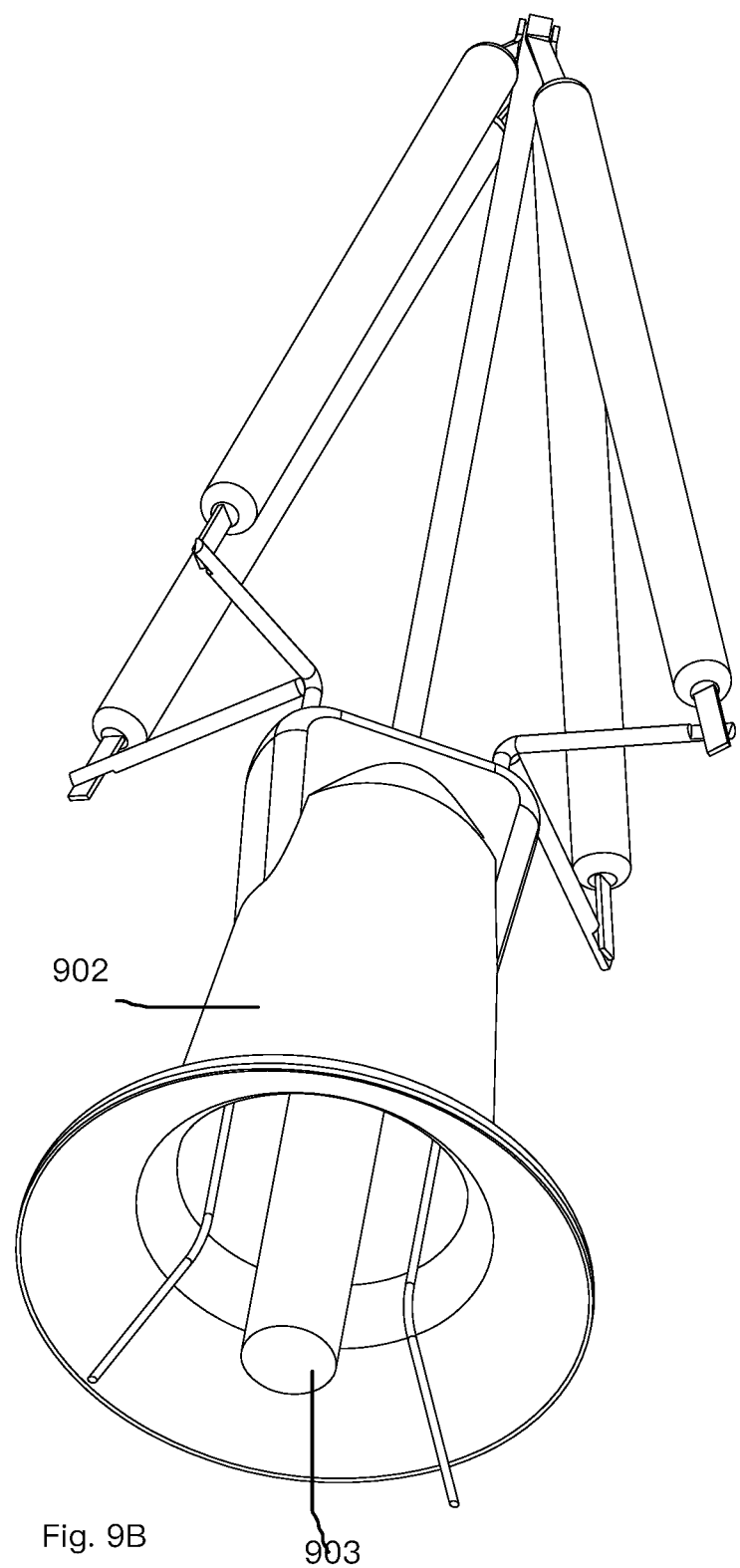
FIG. 9B illustrates the embodiment of FIG. 9A in another view angle.
Figure 9C:
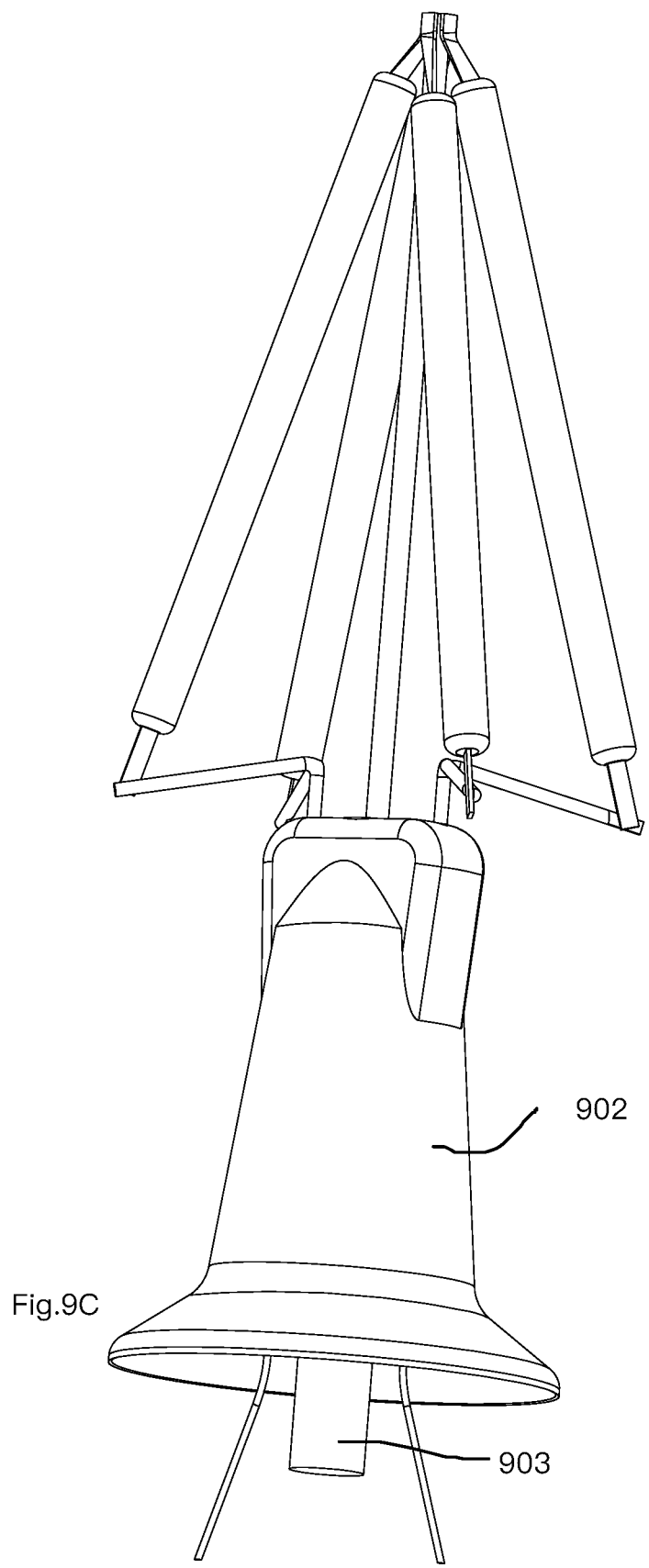
FIG. 9C illustrates the embodiment of FIG. 9A in another view angle.

FIG. 9A illustrates another embodiment. FIG. 9B illustrates the embodiment of FIG. 9A in another view angle. FIG. 9C illustrates the embodiment of FIG. 9A in another view angle.

In FIG. 9A, FIG. 9B and FIG. 9C, there are four light strips 901, with their bottom ends being supported with a larger area by metal wires of a bottom support 902. The central support has an air injection portion 903, which allows heat dissipation air to enter the bulb and is closed by heating the bottom portion 903 after air is filled.

Figure 10A:
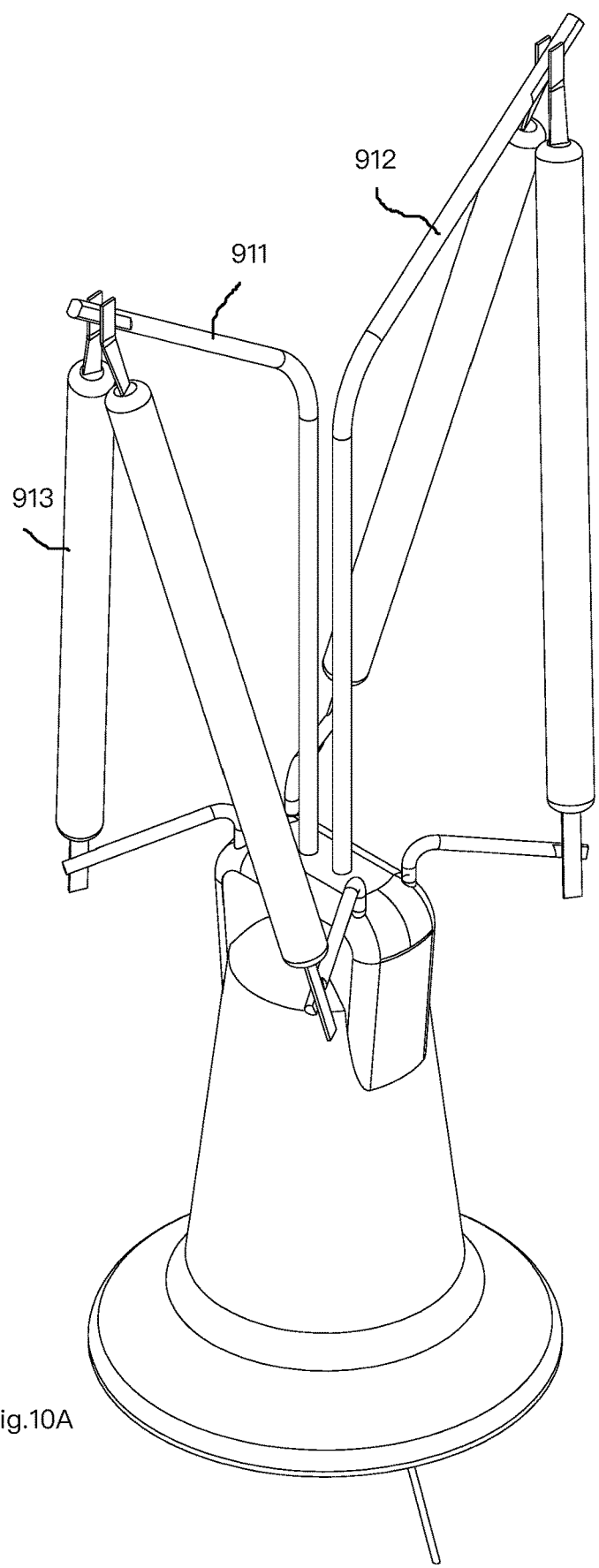
FIG. 10A illustrates another embodiment.
Figure 10B:
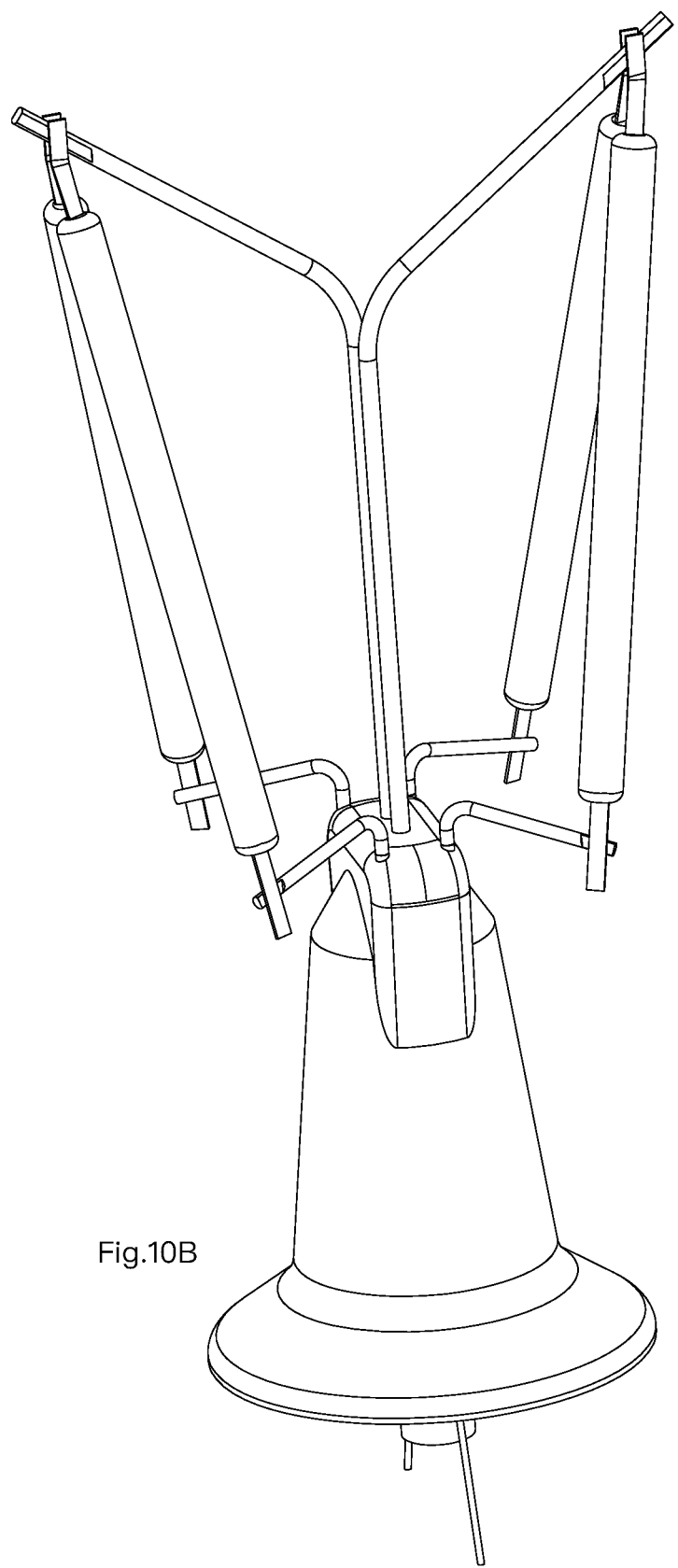
FIG. 10B illustrates the embodiment of FIG. 10A in another view angle.
Figure 10C:
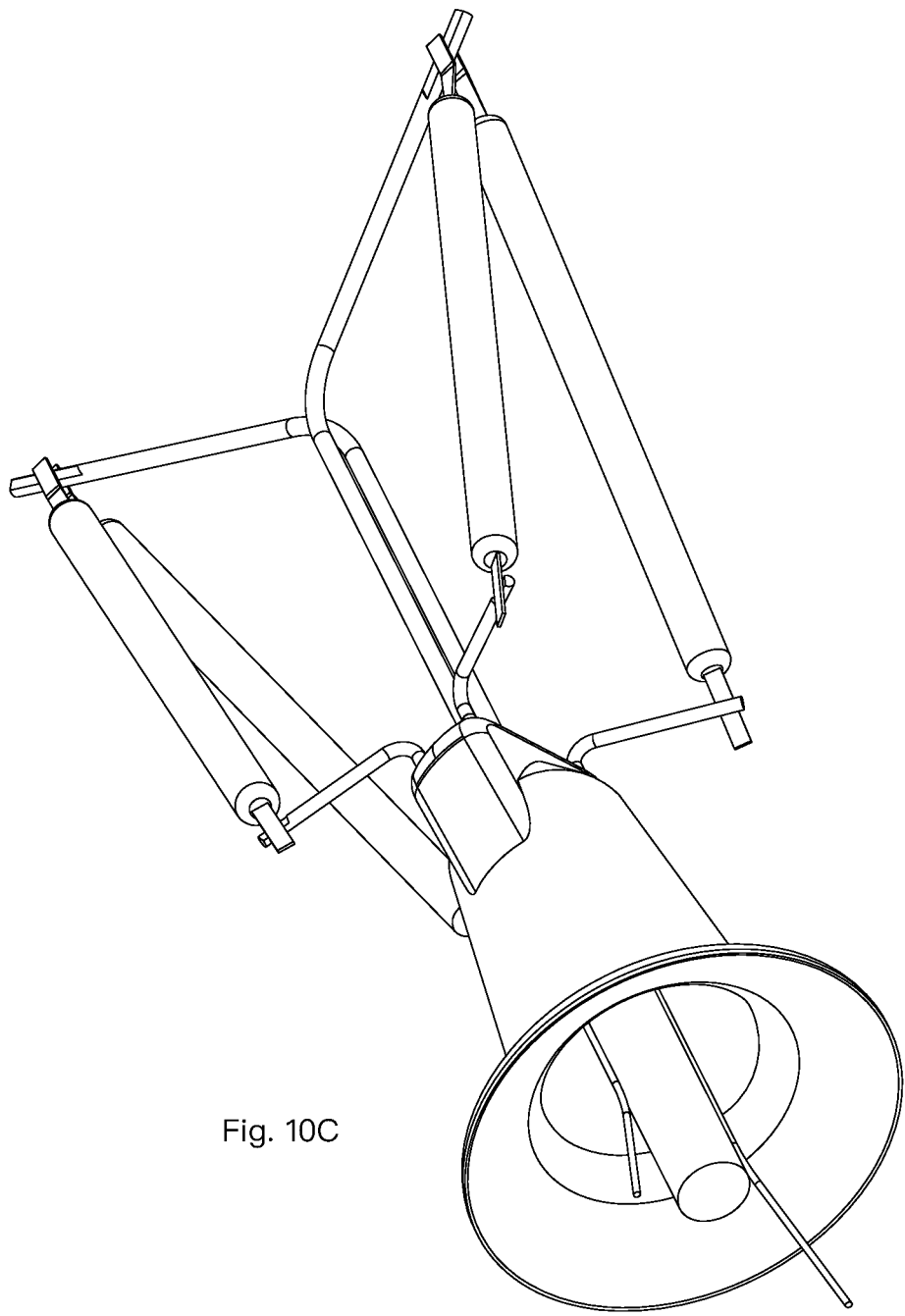
FIG. 10C illustrates the embodiment of FIG. 10A in another view angle.
Figure 10D:
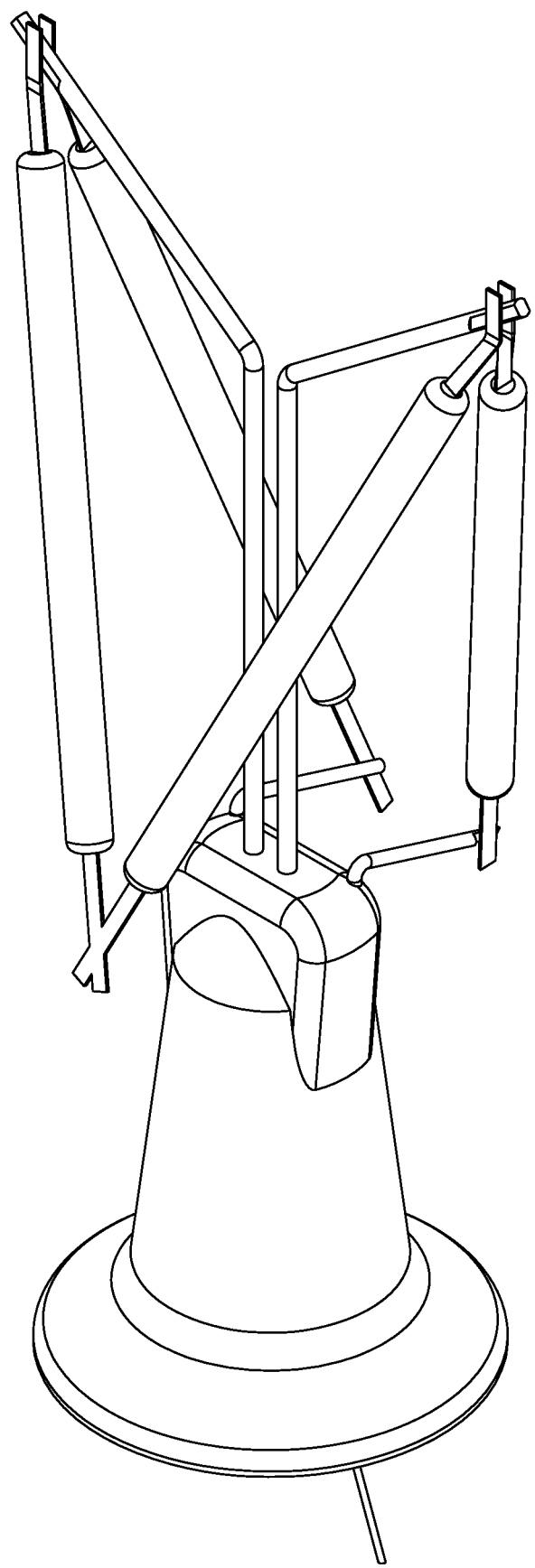
FIG. 10D illustrates the embodiment of FIG. 10A in another view angle.
Figure 10F:
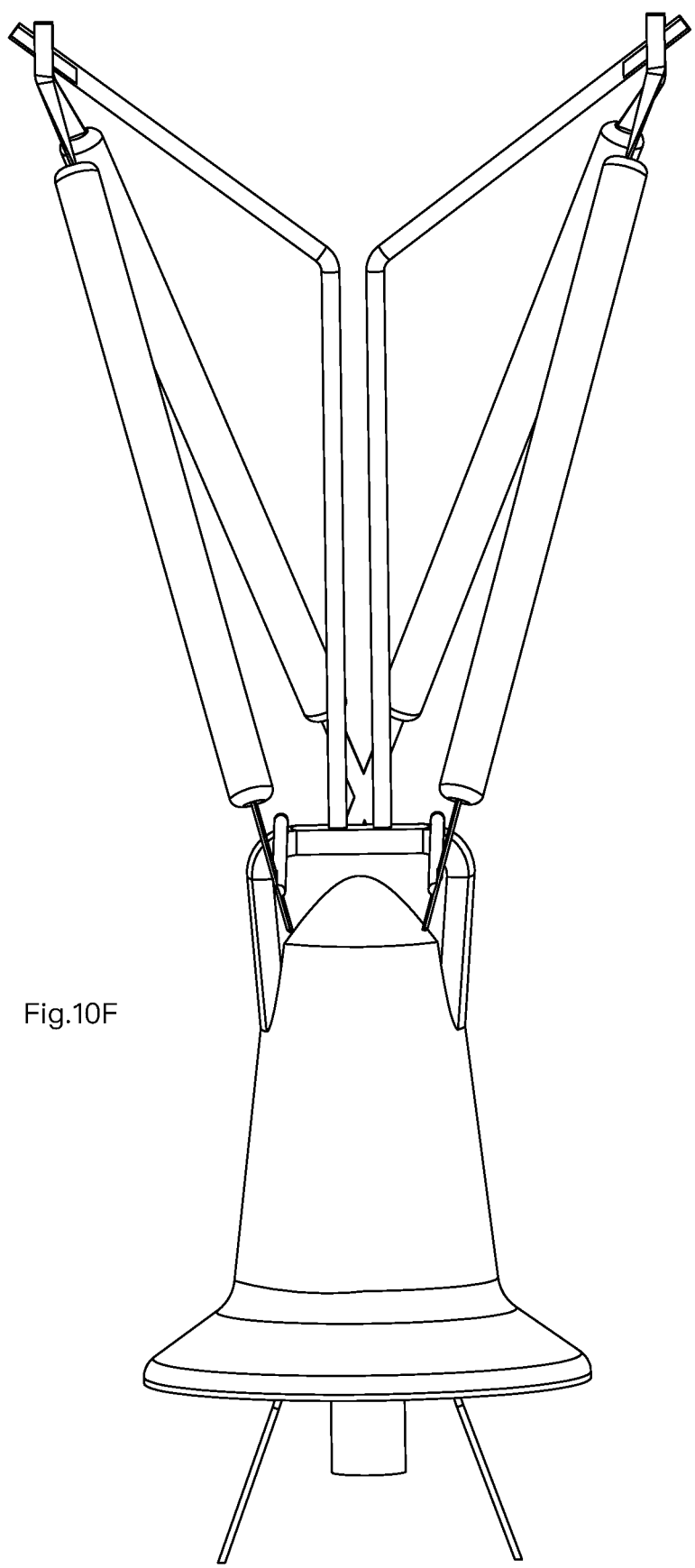
FIG. 10F illustrates the embodiment of FIG. 10A in another view angle.

FIG. 10A illustrates another embodiment. FIG. 10B illustrates the embodiment of FIG. 10A in another view angle. FIG. 10C illustrates the embodiment of FIG. 10A in another view angle. FIG. 10D illustrates the embodiment of FIG. 10A in another view angle. FIG. 10E illustrates the embodiment of FIG. 10A in another view angle. FIG. 10F illustrates the embodiment of FIG. 10A in another view angle.

In this example, there are two vertical bars with their top portions 911, 912 bent to get a larger area to expand the light strip 913.

In addition to the above-described embodiments, various modifications may be made, and as long as it is within the spirit of the same invention, the various designs that can be made by those skilled in the art are belong to the scope of the present invention.

The invention claimed is:

1. A LED bulb apparatus, comprising:
a bulb shell having a light passing shell and a bottom portion;
a head cap having a neck portion, a first electrode and a second electrode, the neck portion of the head cap being connected to the bottom portion of the bulb shell forming a container space;
a driver circuit storing in the head cap for receiving an external power from the first electrode and the second electrode to generate a driving current; and
at least one light strip having a substrate, a top end, a bottom end, and multiple LED modules mounted on the substrate, a first fluorescent layer covering the multiple LED modules on a first side of the substrate and a second fluorescent layer covering a second side of the substrate, the first side and the second side of the substrate are opposite, the driving current being transmitted via at least one of the top end and the bottom end of the light strip to the LED modules, wherein the substrate of the light strip is a ceramic layer, wherein the substrate has a light transmittance less than 50%.

2. The LED bulb apparatus of claim 1, wherein the light strip further comprising at least one heat dissipation strip fixed to the substrate, the heat dissipation strip is heat conductive to the LED modules and electricity insulated from the LED module for carrying heat of the LED modules away from the LED modules.

3. The LED bulb apparatus of claim 1, wherein the second side of the substrate is mounted with another LED modules.

4. The LED bulb apparatus of claim 1, wherein only the first side of the substrate is mounted with the LED modules, a portion of light emitted by the LED modules from the first side of the substrate passes through the substrate and the second fluorescent layer.

5. The LED bulb apparatus of claim 4, wherein the substrate has at least one through hole, the light of the LED modules passes through the through hole from the first side of the substrate to the second side of the substrate and then passes through the second fluorescent layer.

6. The LED bulb apparatus of claim 5, wherein a portion of the first fluorescent layer is extended into the through hole.

7. The LED bulb apparatus of claim 5, wherein a portion of the second fluorescent layer is extended into the through hole.

8. The LED bulb apparatus of claim 5, wherein there is a convex structure disposed in an inner wall of the through hole.

9. The LED bulb apparatus of claim 1, wherein the substrate has a hook structure protruding from a main surface of the substrate, the hook structure is penetrating into the first fluorescent layer.

10. The LED bulb apparatus of claim 1, wherein a lateral wall has a hook structure.

11. The LED bulb apparatus of claim 1, wherein the first fluorescent layer and the second fluorescent layer are connected wrapping the substrate.

12. The LED bulb apparatus of claim 1, wherein the first fluorescent layer has a larger thickness than the second fluorescent layer.

13. The LED bulb apparatus of claim 1, wherein a lateral side of the substrate is attached with anti-blue-light layer.

14. The LED bulb apparatus of claim 1, wherein the first fluorescent layer and the second fluorescent layer convert a light of the LED modules to output lights of different optical parameters.

15. The LED bulb apparatus of claim 1, wherein the container space is sealed to keep a heat dissipation air storing in the container space, the heat dissipation air comprising oxygen.

16. The LED bulb apparatus of claim 15, wherein the oxygen occupies 1% to 10% of the heat dissipation air.

17. The LED bulb apparatus of claim 16, wherein the oxygen occupies 3% to 8% of the heat dissipation air.

18. The LED bulb apparatus of claim 15, wherein the heat dissipation air comprises Helium.

* * * * *